(12) United States Patent
Marsh

(10) Patent No.: US 11,245,344 B2
(45) Date of Patent: Feb. 8, 2022

(54) MICRO ELECTROSTATIC MOTOR AND MICRO MECHANICAL FORCE TRANSFER DEVICES

(71) Applicant: Encite LLC, Burlington, MA (US)

(72) Inventor: Stephen A. Marsh, Carlisle, MA (US)

(73) Assignee: Encite LLC, Burlington, MA (US)

( * ) Notice: Subject to any disclaimer, the term of this patent is extended or adjusted under 35 U.S.C. 154(b) by 141 days.

(21) Appl. No.: 16/418,254

(22) Filed: May 21, 2019

(65) Prior Publication Data

US 2019/0379304 A1 Dec. 12, 2019

Related U.S. Application Data

(60) Provisional application No. 62/681,715, filed on Jun. 7, 2018, provisional application No. 62/681,725, filed on Jun. 7, 2018.

(51) Int. Cl.
*H02N 2/12* (2006.01)
*H02K 7/116* (2006.01)
*B81B 5/00* (2006.01)

(52) U.S. Cl.
CPC ............. *H02N 2/123* (2013.01); *B81B 5/00* (2013.01); *H02K 7/116* (2013.01); *B81B 2201/035* (2013.01)

(58) Field of Classification Search
CPC .......... H02N 2/123; H02K 7/116; B81B 5/00; B81B 2201/035; B81B 2201/037;
(Continued)

(56) References Cited

U.S. PATENT DOCUMENTS 3,400,282 A 3/1968 Felici
5,043,043 A 8/1991 Howe et al.
(Continued)

FOREIGN PATENT DOCUMENTS

DE 32 41 222 5/1984
DE 10 2008 035629 2/2009
(Continued)

OTHER PUBLICATIONS

International Search Report and Written Opinion, PCT/US19/35536, dated Oct. 24, 2019, p. 1-19.
(Continued)

*Primary Examiner* — Thomas Truong
(74) *Attorney, Agent, or Firm* — Fish & Richardson P.C.

(57) ABSTRACT

Disclosed is a micro electrostatic motor that includes a body having a first and a second face and having a chamber. A first membrane is disposed over the first face of the body and a rotatable disk is disposed in the circular chamber about a member. The disk is disposed in the circular chamber and is free to rotate about the member. The disk has on a first surface thereof a set of three mutually electrically isolated electrodes, with each of the electrodes having a tab portion and being electrically isolated from the member. A second membrane is disposed over the second face of the body and a pair of spaced electrodes are provided on portions of the second membrane, with the pair of spaced electrodes being isolated by a gap between the pair of electrodes. A cylindrical shaped member is disposed in the chamber electrically isolated from the three mutually electrically isolated electrodes on the disc.

21 Claims, 20 Drawing Sheets

(58) Field of Classification Search
CPC ........ B81B 2201/034; B81B 2203/056; B81C 1/00198; B81C 2201/019; B81C 2203/032
See application file for complete search history.

(56) References Cited

U.S. PATENT DOCUMENTS

| | | | |
|---|---|---|---|
| 5,187,399 | A | 2/1993 | Carr et al. |
| 5,687,767 | A | 11/1997 | Bowers |
| 5,836,750 | A | 11/1998 | Cabuz |
| 5,965,958 | A | 12/1999 | Robert et al. |
| 6,106,245 | A | 8/2000 | Cabuz |
| 6,179,586 | B1 | 1/2001 | Herb |
| 6,247,908 | B1 | 6/2001 | Shinohara |
| 6,261,066 | B1 | 7/2001 | Linnemann |
| 6,359,757 | B1 | 3/2002 | Mallary |
| 6,443,154 | B1 | 9/2002 | Jalde |
| 6,568,286 | B1 | 5/2003 | Cabuz |
| 6,758,107 | B2 | 7/2004 | Cabuz |
| 6,889,567 | B2 | 5/2005 | Cabuz |
| 7,090,471 | B2 | 8/2006 | Xie et al. |
| 7,802,970 | B2 | 9/2010 | Singhal et al. |
| 2002/0029814 | A1 | 3/2002 | Unger |
| 2003/0106799 | A1 | 6/2003 | Covington et al. |
| 2003/0231967 | A1 | 12/2003 | Najafi et al. |
| 2004/0103899 | A1 | 6/2004 | Noble |
| 2004/0115068 | A1 | 6/2004 | Hansen et al. |
| 2006/0116585 | A1 | 1/2006 | Nguyen-Dinh et al. |
| 2009/0074595 | A1 | 3/2009 | Chen et al. |
| 2009/0129952 | A1 | 5/2009 | Patrascu et al. |
| 2009/0130607 | A1 | 5/2009 | Slafer |
| 2010/0181871 | A1 | 7/2010 | Daniel et al. |
| 2011/0101823 | A1 | 5/2011 | Anderson et al. |
| 2011/0207328 | A1 | 8/2011 | Speakman |
| 2013/0046330 | A1 | 4/2013 | Kabasawa et al. |
| 2013/0100575 | A1 | 4/2013 | O'Brien et al. |
| 2014/0147346 | A1 | 5/2014 | Chitnis et al. |
| 2015/0267695 | A1 | 9/2015 | Marsh |
| 2018/0038754 | A1 | 2/2018 | Marsh |
| 2019/0041247 | A1* | 2/2019 | Marsh .................. H05K 3/386 |
| 2019/0081576 | A1* | 3/2019 | Yamamoto ............. H02N 1/004 |

FOREIGN PATENT DOCUMENTS

| | | |
|---|---|---|
| EP | 1 926 678 | 6/2008 |
| JP | H04 295720 | 10/1992 |
| JP | 2004-112884 | 8/2004 |
| WO | WO 2016/069988 | 5/2016 |

OTHER PUBLICATIONS

S.D. Rapoport et al., "Fabrication and testing of a microdynamic rotor for blood flow measurements." Journal of Micromechanics and Microengineering, Institute of Physics Publishing, vol. 1, No. 1, Mar. 1991, p. 60-65.

Supplementary European Search Report, Application No. EP 18 84 2287, dated Apr. 9, 2021, p. 1-10.

International Search Report and Written Opinion, PCT/US2109/035517, dated Aug. 19, 2019.

* cited by examiner

MICRO ELECTROSTATIC MOTOR AND MICRO MECHANICAL FORCE TRANSFER DEVICES

CLAIM OF PRIORITY

This application claims priority under 35 U.S.C. § 119(e) to provisional U.S. Patent Application 62/681,715, filed on Jun. 7, 2018, entitled: "Micro Electrostatic Motor and Micro Mechanical Force Transfer Devices," and provisional U.S. Patent Application 62/681,725, filed on Jun. 7, 2018, entitled: "Micro Electrostatic Motor and Micro Mechanical Force Transfer Devices," the entire contents of which are hereby incorporated by reference.

BACKGROUND

This specification relates to miniature electrostatic motors and micro force transfer devices such as gears and gear trains.

An electric motor is a machine that converts electrical energy into mechanical energy. There are various types of electric motors as well as various fabrication techniques and technologies used to construct such motors. Selection of both a motor type and a fabrication technology are driven by performance, application suitability and cost considerations. Most electric motors include a stator (stationary element that has a magnetic field) and a rotor that rotates and has conductors that carry currents. The motor operates through an interaction between the motor's magnetic field and the currents generated in the conductors of the rotor.

Another type of electric motor is an electrostatic motor. Electrostatic motors operate using capacitive effects based on attraction and repulsion of electric charges.

Force transfer through gears and such devices is well-known. A gear is a machine part that has teeth cut into the part that can interact with corresponding teeth in another machine part to transmit torque from a driven gear to a drove gear. A set of geared devices can change the speed, torque, and/or direction of a source of force. A set of two or more gears can provide a change in torque. The teeth on two meshing gears that have the same shape and working in a sequence are referred to as a gear train. If one gear of the gear train is larger than the other, the rotational speeds and the torques of the two gears will differ in proportion to the diameters of the gears.

Various techniques and technologies have been used to produce gears according to performance, application suitability and cost considerations.

SUMMARY

According to an aspect, a micro electrostatic motor includes a body having a first and a second face, the body having a circular chamber defined by an interior wall, a central member, a disk disposed in the circular chamber, the disk physically spaced from the interior wall of the chamber, a set of three mutually electrically isolated electrodes supported on a first surface of the disk, with each of the electrodes having a tab portion and with the electrodes being electrically isolated from the central member, a first membrane over the first face of the body, a second membrane over the second face of the body, and a pair of spaced electrodes on portions of the second membrane, the pair of spaced electrodes being isolated by a gap.

The above aspect may include amongst other features one or more of the following features:

The pair of second electrodes each have a first aperture in a portion of each of the second pair of electrodes to accommodate a conductive via to make an exterior electrical connection. The second membrane supports the pair of second electrodes has a pair of apertures in portions of the second membrane over a path that the tabs travel due to rotation of the disk member. The micro electrostatic motor further includes a first sealing layer over the first membrane and a second sealing layer over the second membrane. The central member is a fixed member that is affixed between the first and the second membranes, and the central member is spaced from the disk by an annular gap. The central member is attached to the disk. The central member is spaced from the disk an annular gap, the motor further includes a membrane layer having a central region that is adhered to the central member and having a first annular gap in alignment with the annular gap between the disk and central member and a second annular gap about an outer periphery of the first annular gap, and a spacer layer having a central region that is adhered to the central region of the membrane layer, and having a first annular gap in alignment with the annular gap between the disk and central member and the first annular gap of the membrane. The micro electrostatic motor further includes a ground plane disposed on first membrane. The body member has a pair of ports to allow fluid flow through the chamber. The disk and the central member are comprised of a material that also comprises the body frame.

According to an aspect, a micro electrostatic motor includes a body having a first and a second face, the body having at least an outer wall and an interior wall, the interior wall defining a circular chamber, a disk disposed in the circular chamber, the disk physically spaced from the interior wall of the chamber, the disk having a central member portion, a set of three mutually electrically isolated electrodes supported on a first surface of the disk, with each of the electrodes having a tab portion and being electrically isolated from the central member portion, a first membrane over the first face of the body, the first membrane in contact with surface portions of the body defined between the at least outer wall and interior wall and a surface of the central member portion, with the first membrane having an annular void defined around the portion of the first membrane in contact with the central member, a second membrane in contact with opposing surface portions of the body defined between the at least outer wall and interior wall, and a pair of spaced electrodes on portions of either the first or the second membrane, the pair of spaced electrodes being isolated by a gap.

The above aspect may include amongst other features one or more of the following features:

The pair of second electrodes each have a first aperture in a portion of each of the second pair of electrodes to accommodate a conductive via to make an exterior electrical connection. The first membrane supports the pair of second electrodes and has a apertures in portions of the first membrane over a path that the tabs travel due to rotation of the disk member. The annular void defined about the portion of the first membrane in contact with the central member frees the central member to rotate in conjunction with the disk to define a shaft as the combination of the portion of the first membrane in contact with the central member and the annular void. The second membrane is further in contact with an opposing surface of the central member, the second membrane having an annular void defined around the portion of the second membrane in contact with the opposing surface of the central member.

According to an aspect, a micro electrostatic motor includes a body having a first and a second face, the body having at least an outer wall and an interior wall, the interior wall defining a circular chamber, a disk disposed in the circular chamber, the disk physically spaced from the interior wall of the chamber, the disk having a first membrane layer having a central region that is adhered to the central member portion and having a first annular gap in alignment with the annular gap that spaces central member portion from the disk portion, and a second annular gap about an outer periphery of the first annular gap, and a spacer layer having a central region that is adhered to the central region of the membrane layer, and having a first annular gap in alignment with the annular gap that spaces the central member portion from the disk and further in alignment with the first annular gap in the membrane, a second membrane in contact with opposing surface portions of the body defined between the at least outer wall and interior wall, and a pair of spaced electrodes on portions of either the first or the second membrane, the pair of spaced electrodes being isolated by a gap.

The above aspect may include amongst other features one or more of the following features:

The pair of second electrodes each have a first aperture in a portion of each of the second pair of electrodes to accommodate a conductive via to make an exterior electrical connection. The first membrane supports the pair of second electrodes and has a apertures in portions of the first membrane over a path that the tabs travel due to rotation of the disk member. The first annular void defined about the portion of the first membrane in contact with the central member affixes the central member to inhibit rotation of the central member to define an axle as the combination of the portion of the first membrane in contact with the central member and the first annular void, and the annular region defined between the first and second annular voids, defines an collar to transfer rotation of the disk about the axle. The surface of the disk is a first surface, and the second membrane is further in contact with an opposing surface of the central member, the second membrane, the second membrane having a first annular void defined around the portion of the second membrane in contact with the central member, and having a second annular void defined around and spaced from the first annular void, the first and second annular voids defining an annular region of the first membrane that is in contact with a second surface of the disk.

According to an aspect, a micro electrostatic motor includes a first motor stack, including a first body having a first chamber, a first membrane over a first face of the first body, and a first disk rotatably disposed in the first chamber having on a first surface thereof a first set of three mutually electrically isolated electrodes, with each of the electrodes having a tab portion, a second motor stack comprising: a second body having a second chamber, a second membrane over a first face of the second body, and a second disk rotatably disposed in the second chamber having on a first surface thereof a second set of three mutually electrically isolated electrodes, with each of the electrodes having a tab portion, and an interface between the first motor stack and the second motor stack.

According to an aspect, a method of producing a micro electrostatic device having a rotatable element includes patterning a sheet of material having an electrically conductive layer to provide from the sheet a frame having walls, with an interior wall defining a chamber, a disk in the chamber with at least three electrode layers each having tabs to form a rotor element, and a central member, adhering a first membrane supporting a pair of spaced electrodes on the first membrane to form spaced stator electrodes, patterning the first membrane to provide a first annular void defined around the portion of the first membrane in contact with the central member, and forming vias for electrical connections in the sheet and membrane.

The above aspect may include amongst other features one or more of the following features:

The method wherein patterning the sheet further includes patterning the sheet to provide the patterned disk and the central member attached to the disk. The method wherein the annular void defined about the portion of the first membrane is in contact with the central member and frees the central member to rotate in conjunction with the disk to define a shaft as the combination of the portion of the first membrane in contact with the central member and the annular void. The method wherein patterning the sheet further includes patterning the sheet to provide the patterned disk physically spaced from the central member. The method wherein the first annular void defined about the portion of the first membrane in contact with the central member affixes the central member to inhibit rotation of the central member to define an axle as the combination of the portion of the first membrane in contact with the central member and the first annular void. The method wherein patterning the membrane further includes patterning the membrane to define a second annular void defined around and spaced from the first annular void, the first and second annular voids defined an annular region of the first membrane that is in contact with a surface of the disk, and wherein the annular region defined between the first and second annular voids, defines an collar to transfer rotation of the disk about the axle.

One or more of the above aspects may provide one or more of the following advantages.

Components can include micro features that are rotatable about a fixed member and that can be fabricated using relatively inexpensive techniques, such as variations on roll to roll processing. These rotatable features can be adapted for use with or in various components such as for rotors used in micro electrostatic motors.

The micro electrostatic motors can be made using micro fabrication methods and can be used either as a high speed, low torque motor or a low speed high torque motor for a variety of industrial, medical, and biological applications. The micro electrostatic motor devices described below are fabricated using relatively inexpensive techniques. In particular embodiments, the micro electrostatic motor devices described below are fabricated using roll to roll manufacturing techniques.

The details of one or more embodiments of the invention are set forth in the accompanying drawings and the description below. Other features, objects, and advantages of the invention are apparent from the description and drawings, and from the claims.

DETAILED DESCRIPTION

Micro-Electrostatic Motor Overview

Micro electrostatic motors described herein are made using inexpensive micro fabrication methods and can be used for conversion of electrical energy to mechanical energy in various industrial, commercial, medical, and biological applications. Micro electrostatic motor devices are fabricated on a micron/millimeter scale. Several fabrication techniques are disclosed.

A conventional synchronous, electrostatic motor type can be considered as a variable capacitor that rotates in response to an input, e.g., a square-wave voltage that is applied between stator and rotor plates. When the synchronous electrostatic motor rotates at a speed that is synchronous with respect to the applied square wave, the rotor turns half a revolution per cycle of the square wave.

In a conventional asynchronous electrostatic motor type, the operation depends on an electric field that gives rise to induced charges on a surface causing the field to exert a torque on the surface. This effect is used in an asynchronous electrostatic motor by electrically coupling the rotating field to a set of stationary electrodes, using phase-shifted voltages on different sets of the stationary electrodes.

Figure 1:
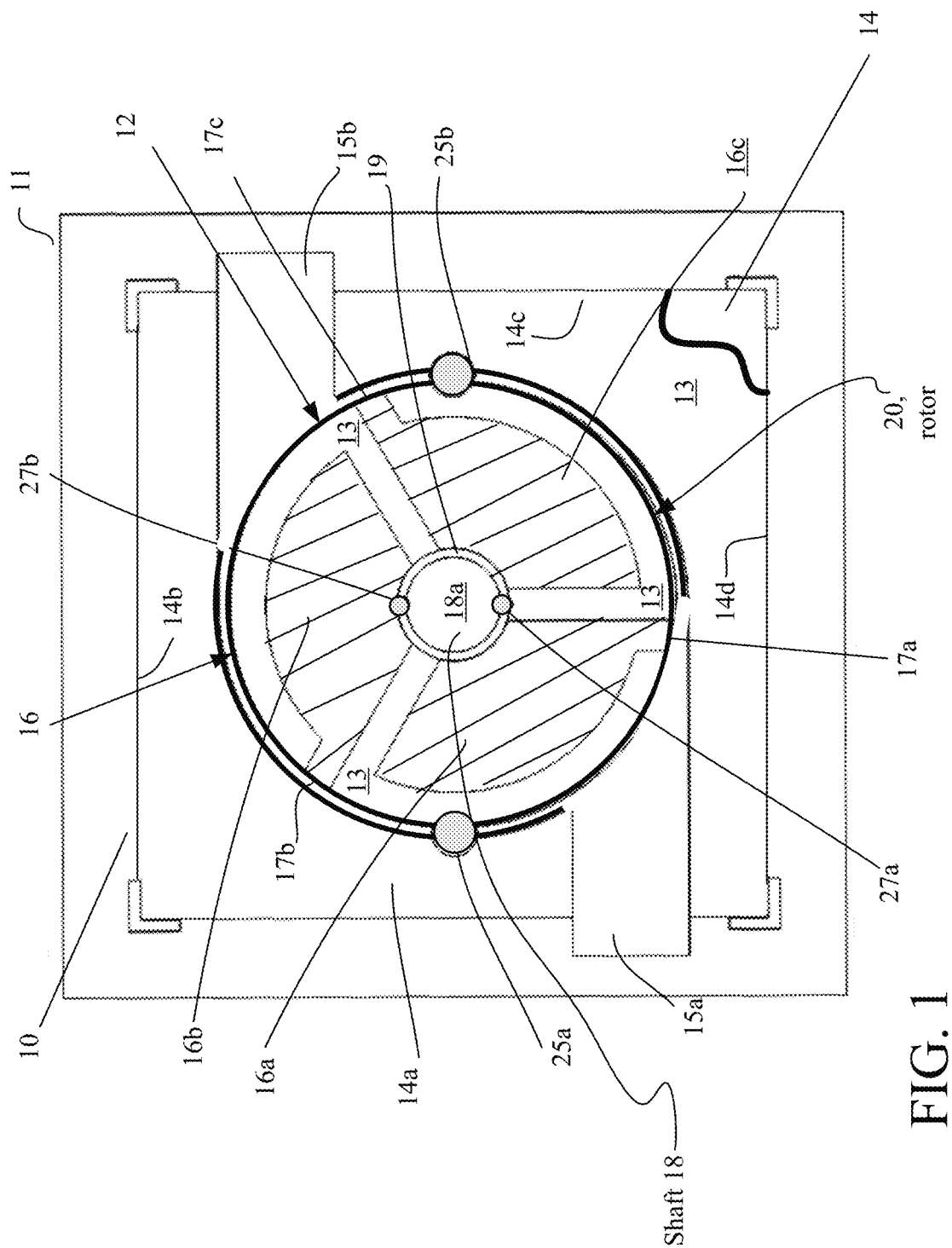
FIGS. 1-3 are plan views of an electrostatic motor in stages of construction.

Referring to FIG. 1, a micro electrostatic motor device 10 in a stage of construction is shown. FIG. 1 shows a front-side 10a of the micro electrostatic motor device 10. The micro electrostatic motor device 10 is shown on a carrier layer, e.g., a web 11 or a layer carried by the web 11 (for roll to roll processing discussed below) and includes a single circular chamber 12. This initial discussion of the micro electrostatic motor device 10 will explain certain details and principles of operation of the micro electrostatic motor device 10. The micro electrostatic motor device 10 can be either a synchronous or asynchronous type.

The micro electrostatic motor device 10 includes a body 14 (either carried by the web for roll-to-roll processing or as part of the web) having plural external walls, e.g., four walls 14a-14d and an interior circular wall defining the circular chamber 12. Two of the walls, e.g., walls 14a, 14c of the body 14, optionally, can have ports 15a, 15b that provide fluid ingress or egress from an external fluid source and an external fluid sink (not shown). In operation, one of the optional ports 15a, 15b acts as an inlet to a fluid flow and the other one of the optional ports 15a, 15b acts as an outlet to fluid flow, e.g., air for cooling of the motor (with assignment of input vs. output to the ports determined according to rotational direction of a rotor portion of the motor).

The micro electrostatic motor device 10 also includes a central rotatable disk 16 (disk 16) that is produced from the material of the body layer 14, is electrically non-conductive, and which supports three electrically isolated metal electrodes 16a-16c. In this implementation, the disk 16 is a flat plate or platen (disk 16) disposed about a central cylindrical member 18 (member 18) that is either used as a shaft 18' (a freely rotatable member attached to the disk 16) or used as an axle 18" (a fixed member that does not rotate but about which the disk 16 rotates within the chamber). Details of construction of member 18 as a shaft 18' will be set out in FIG. 4 and details of construction of member 18 as an axle 18" will be discussed in FIG. 5.

The electrically isolated electrodes 16a-16c are spaced apart by 120 degrees of physical separation. The electrically isolated electrodes 16a-16c are spaced apart by non-conductive channels provided by patterning the electrodes on the disk 16. Each isolated electrode 16a-16c has an electrically conductive tab protrusion portion, i.e., tabs 17a-17c, respectively. The disk 16 carrying the electrically isolated electrodes 16a-16c and electrically conductive tabs 17a-17c together function as a rotor (and will be referred to hereinafter as rotor 20).

The member 18 when configured as an axle 18" has the rotor 20 rotating about the member 18 that is stationary. In the axle 18" implementation, the rotor 20 is physically and electrically isolated from the member 18 by a relatively small gap 19a that is devoid of the metal used to form the electrodes 16a-16c and devoid of the material used to form the disk 16.

Member 18 when configured as a shaft 18' has the rotor 20 physically attached to the member 18 and has the electrodes 16a-16c electrically isolated from the shaft 18' by the relatively small gap 19a that is devoid of the metal used to form the electrode 16a-16c. By relatively small gap is meant that the gap is of a size sufficient to allow the electrodes 16a-16c on the rotor 20 to be electrically isolated from the member 18. The gap size of the gap 19a is of micrometers in size, sufficiently large so that the central core 16a is not electrically coupled to the member 18.

While the rotor 20 is shown having three electrodes as the plural isolated electrodes 16a-16c, which are spaced by 120 degrees of separation with the electrically conductive electrically isolated tabs 17a-17c, in some implementations there can be more than three electrodes and corresponding tabs that would be spaced according to 360 degrees/n where n is the number of electrodes.

Also shown in FIG. 1 are bridge members 25a and 25b, e.g., elements that are patterned from the body 14 and used to tether the rotor 20 to the body 14 during fabrication processes. Also shown in FIG. 1 are bridge members 27a, 27b used to tether the member 18 to the rotor 20 during fabrication and a backside membrane 28.

Figure 2:
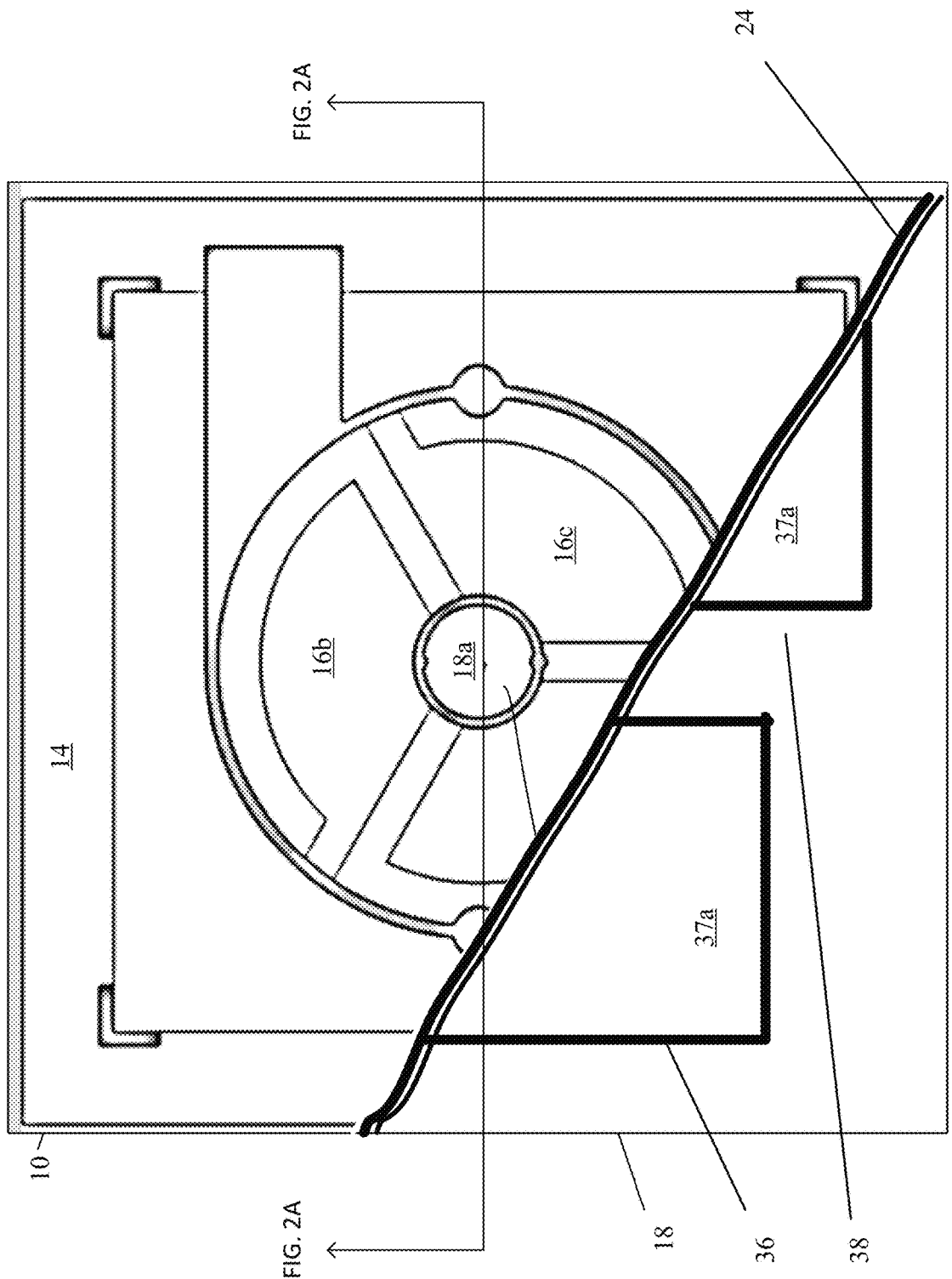

Referring now to FIG. 2, the assembly of FIG. 1 is shown with the bridge members 25a and 25b and bridge members 27a, 27b (FIG. 1) removed, leaving the rotor 20 attached to the member 18 at a subsequent stage of fabrication. Also shown in FIG. 2 is a first membrane layer 24 disposed over the front side 10a of the motor 10 that supports a metalized surface 37a (shown peeled back), which first membrane layer 24 is patterned to form electrodes 36 and 38.

The bridge members (not shown) which were used to tether the member 18 and disk were removed subsequent to this stage of fabrication.

Figure 3:
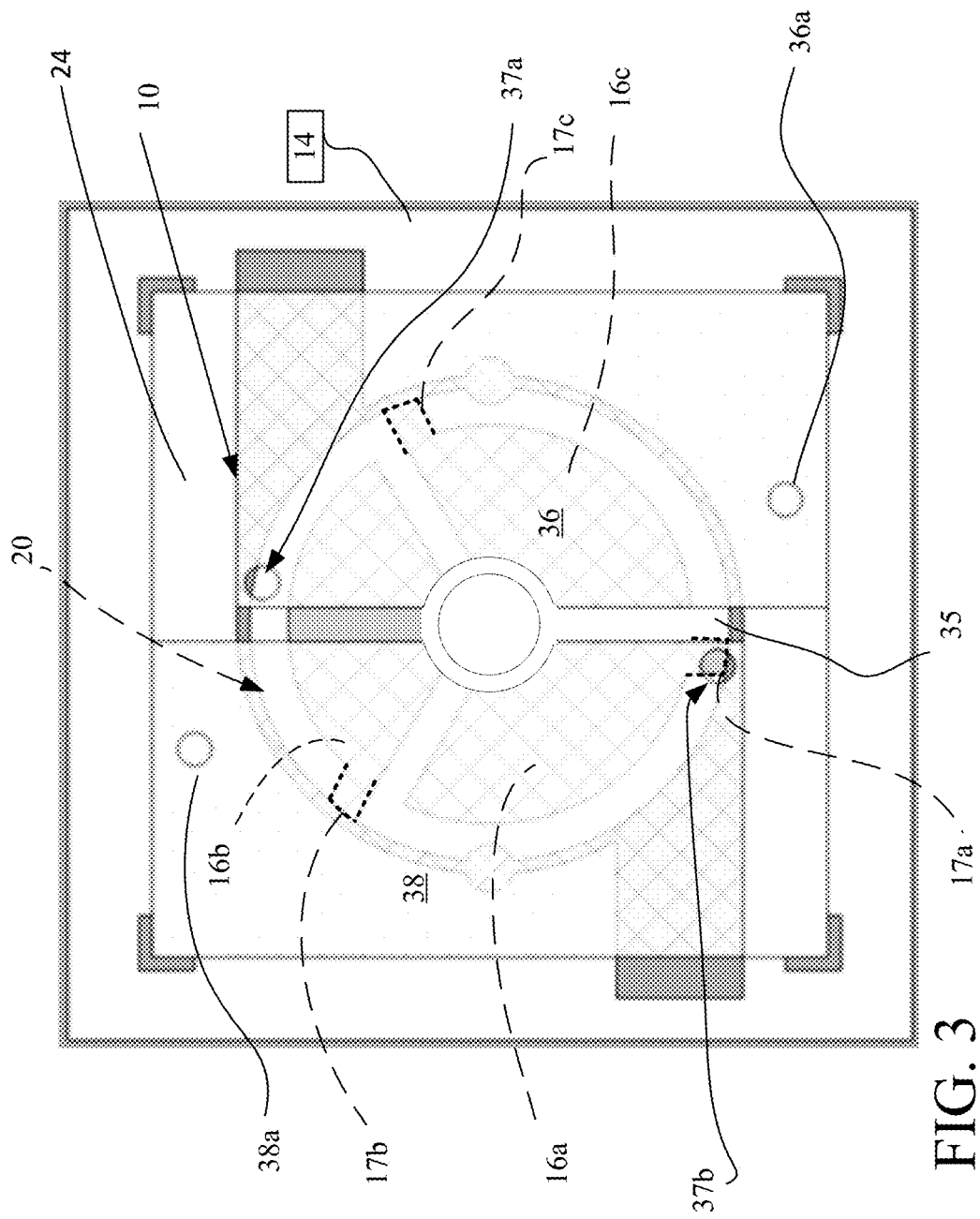

Referring now to FIG. 3, the micro electrostatic motor device 10 in a subsequent stage of fabrication is shown. The rotor 20 is shown in phantom with the bridges (removed). The micro electrostatic motor device 10 includes the pair of electrodes 36, 38 (used as stators) disposed on the membrane layer 24 over the body 14 and which electrodes are electrically isolated by a gap 35. Each of the electrodes 36, 38 has a corresponding one of a pair of holes 36a, 38a. Holes 36a and 38a will house conductive vias to provide electrical connections to supply voltages to the electrodes 36 and 38, respectively.

The second membrane 37 has a pair of holes 37a, 37b. Holes 37a and 37b are in alignment with a circular path that the tabs 17a-17c travel as the rotor 20 rotates. The pair of electrodes 36, 38 in addition to being electrically isolated from one another are also electrically isolated by the membrane layer 24 from the electrodes 16a-16c disposed on the body 14 and their associated tabs 17a-17c. In FIG. 3, the tabs 17a-17c are shown in darkened phantom lines for ease in viewing in conjunction with an explanation below. The electrodes 36 and 38 are also patterned in regions about member 18 to be physically and electrically isolated from member 18.

Shaft Implementation

Figure 4:
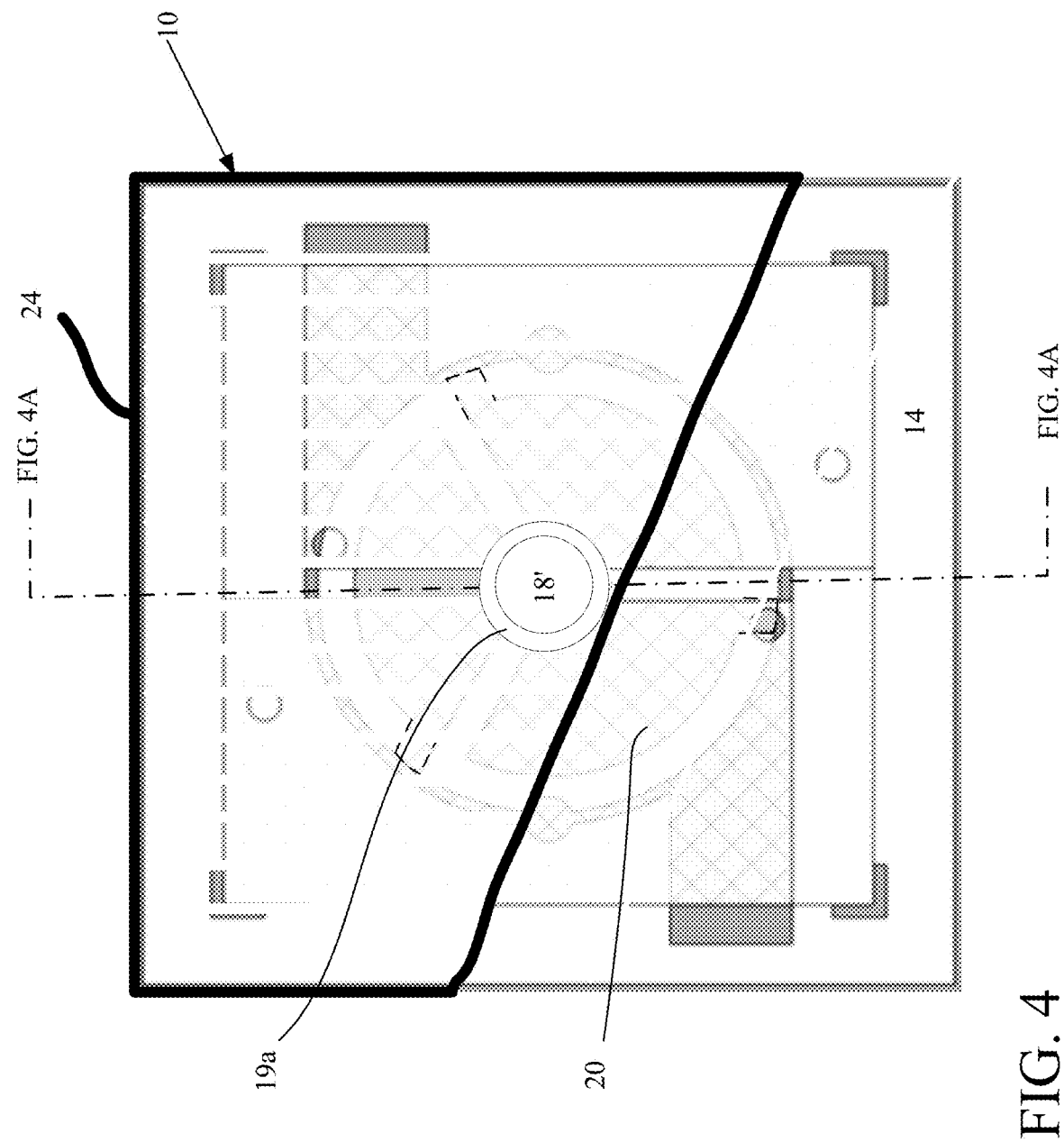
FIGS. 4-5 are plan views, each partially broken away, of respectively, a shaft implementation of the electrostatic motor and an axle implementation of the electrostatic motor in respective stages of construction.
Figure 4A:
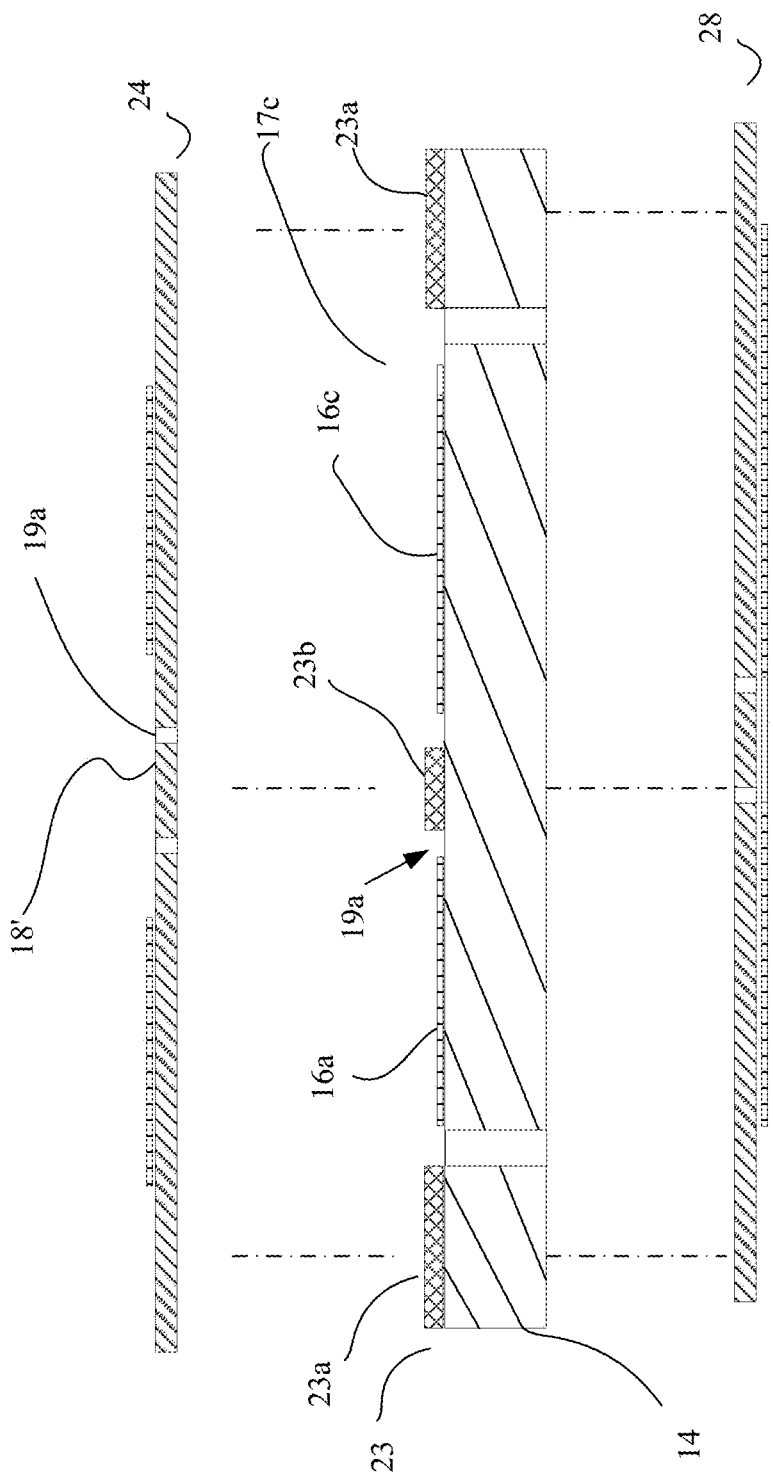
FIG. 4A is an exploded cross-sectional view of FIG. 4.
Figure 4B:
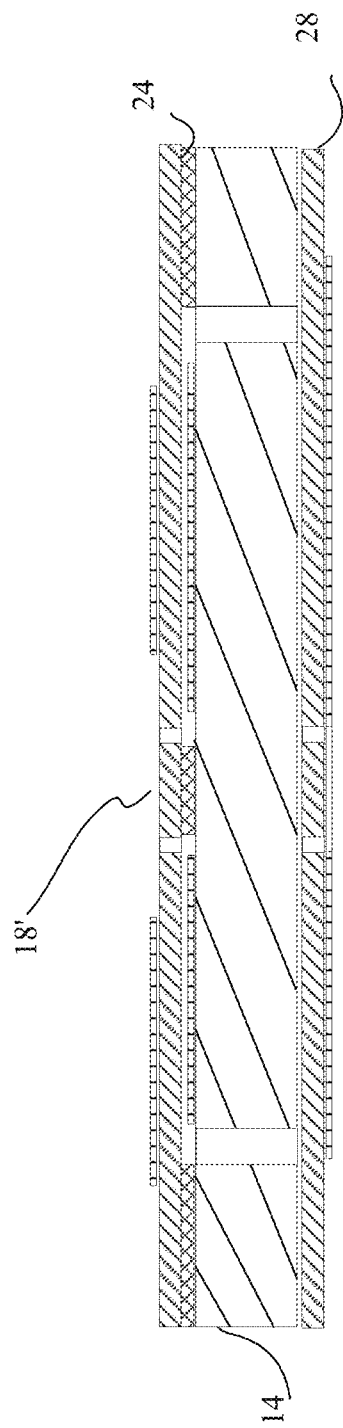
FIG. 4B is a cross-sectional view showing the micro electrostatic motor of FIGS. 4, 4A with layers attached together.

Referring now to FIG. 4, and especially FIGS. 4A and 4B, a shaft implementation is shown. In a shaft implementation, during construction of the motor 10, e. g., following construction of the rotor 20 and prior to adding the membrane layer 24, an adhesive layer 23 is patterned and portions 23a, 23b thereof remain on the top surfaces of the walls (referenced in FIG. 1) of the body 14 and in a region about the center of the rotor 20 (the region about the center of the rotor that will form the shaft 18'). The membrane layer 24 provided over the motor 10 adheres to the top surfaces of the walls of the body 14 and to the center of the rotor 20. Other portions of the membrane 24 are in contact with, but do not adhere to other portions of the motor 10, e.g., the rotor 20. Thus, the rotor 20 is free to rotate, being confined in one dimension by the membrane 24 (and a backside membrane 28). The membrane layer 24 is patterned leaving an annular void (i.e., the gaps 19a, 19a'), as shown. This annular void or gap 19a leaves the portion of the membrane 24 that is adhered to the center of the rotor 20 free to rotate thus allowing that center portion of the membrane to provide a portion of shaft 18'.

In FIG. 4B, a second adhesive layer (not shown) is patterned to have adhesive material (not shown) remaining on the bottom surfaces of the walls of the body 14 and a central region of the rotor. A second membrane 28 is disposed to adhere to the bottom surfaces of the walls of the body 14 and in the center region on the backside of the motor 10. The second membrane layer 28 adheres to, e.g., the bottom surfaces of the walls of the body 14 and to the center of the backside of the rotor 20. The second membrane layer 28 is patterned leaving a second annular void. This second annular void 29a leaves the portion of the membrane 28 that is adhered to the center of the backside of the rotor 20 free to rotate thus carrying the shaft 18' to the bottom of the motor 10. The second membrane 28 can carry a ground plane (as shown) if desired. The front side and the backside can be thinned if desired.

A motor element 10 with a shaft 18' is thus provided by the body layer 14 that is sandwiched between two body membrane layers 24 and 28. The shaft 18' can extend to and (in some embodiments through) one or both major opposing surfaces of the motor 10.

Axle Implementation

Figure 5:
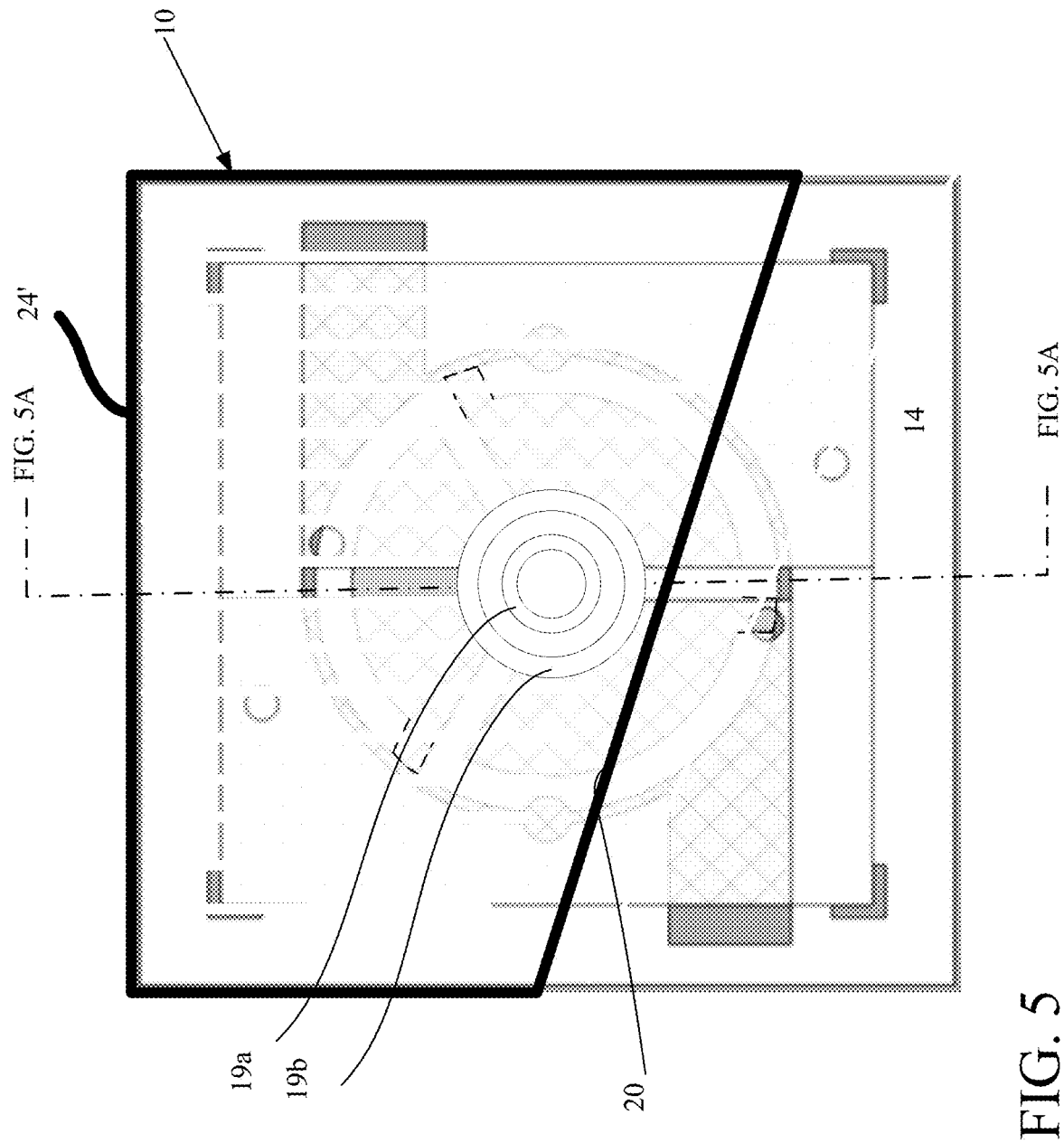
Figure 5A:
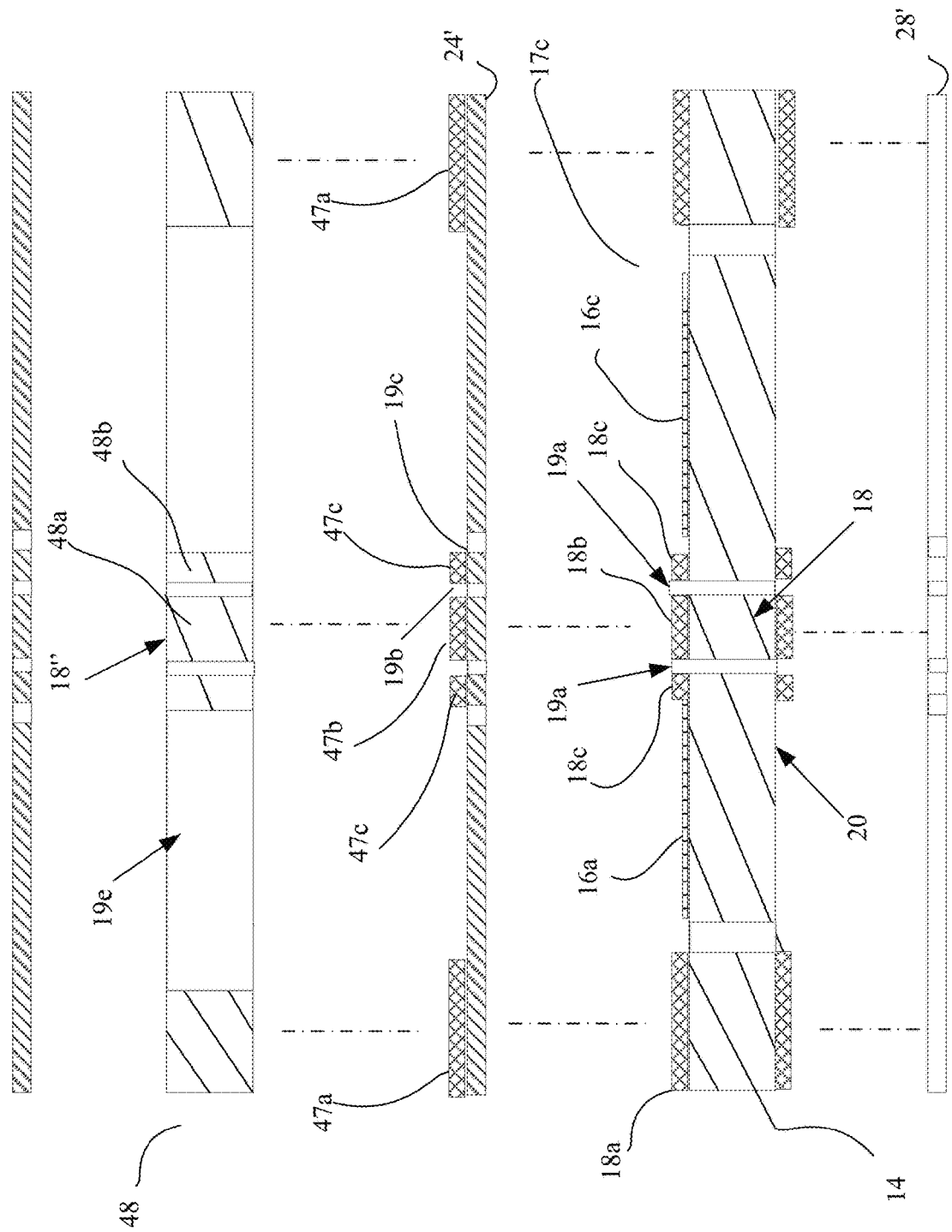
FIG. 5A is an exploded cross-sectional view of FIG. 5.

Referring now to FIGS. 5 and 5A, in an axle implementation, during construction of the motor 10, the body layer 14 is patterned to provide the rotor 20 and the central member 18 physically spaced via gap 19a from the rotor 20 (see FIG. 5A). Following construction of the rotor 20, prior to adding a membrane 24' (functionally similar to membrane 24, except for certain patterning differences).

In FIG. 5A, an adhesive layer (not shown) is patterned leaving first regions 23a of adhesive on the top surfaces of the walls (referenced in FIG. 1) of the body 14, a second region 23b of adhesive on the central member 18, and a third region 23c that is an annular region of adhesive spaced from the second region 23b of adhesive material. The membrane layer 24' is disposed over the adhesive regions 23a-23c. The membrane layer 24' adheres in the regions having the adhesive material, i.e., to the top surfaces of the walls of the body 14, the center region of the rotor 20 (due to the second region 23b of adhesive material) and in the third region 18c the annular region of adhesive material. Other portions of the membrane 24' are in contact with, but not adhered to other portions of the motor 10, e.g., the rotor 20, and thus the rotor 20 is free to rotate confined by the membrane 24'.

In FIG. 5A another adhesive layer (not shown) provided on the membrane 24'. The membrane layer 24' is patterned leaving a first annular void 19b aligned with the gap 19a that is between the first region 23a and the second region 23b of adhesive material (of the body member 14). The membrane layer 24' is further patterned leaving a second annular void 19c spaced from the annular gap 19b, as shown. The first annular void 19b is disposed about the portion of the membrane 24' that is adhered to the member 18 via the adhesive region 23b (of the body member 14). The adhesive layer (not shown) on the membrane 24 is patterned leaving adhesive material on regions 47a, 47b and 47c.

A body layer 48 is disposed on the patterned membrane 24' and the body layer 48 is patterned to leave body walls (not referenced), a central portion 48a, spaced by a gap 19d from an annular member portion 48b of the body layer 48, and the annular member portion 48b spaced from the body walls (not referenced), by an annular void 19c. Because the member 18 is physically spaced from the rotor 20, and yet the member 18 is adhered to the membrane 24' (and a corresponding backside membrane 28'), the member 18 is fixed and will not rotate, as rotor 20 rotates. Thus, member 18 in this implementation acts as an axle 18''.

The axle 18'' is carried through layers 24' and 48 to the top of layer 48. As an axle 18'' as the rotor 20 rotates about the fixed axle 18'', the arrangement of the motor 10 and the axle 18'' can provide a fan or blower element (by for example adding fins or blades to the rotor element 20.

Figure 5B:
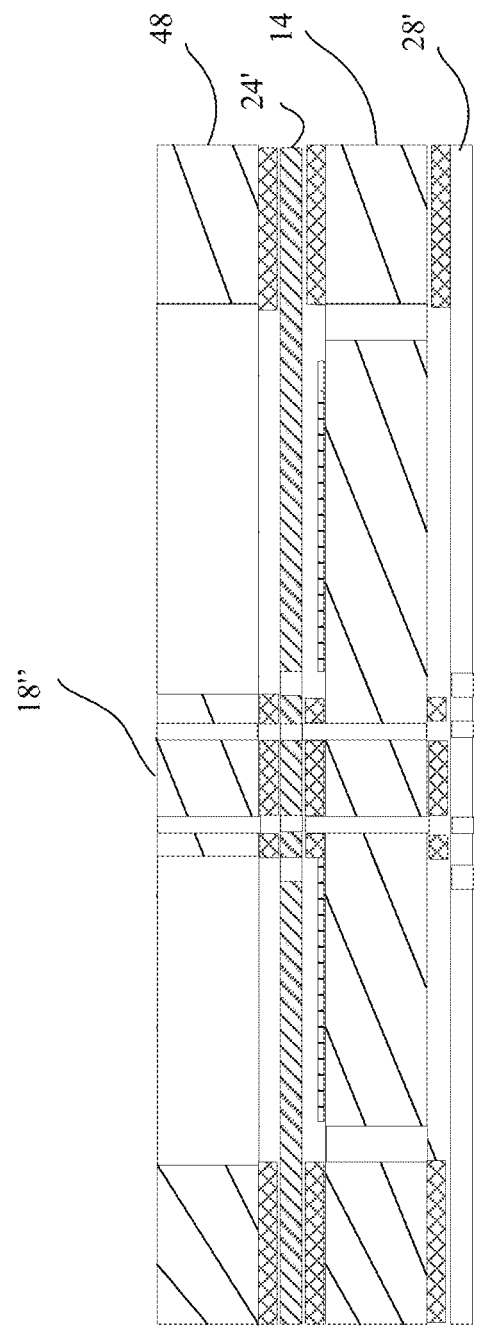
FIG. 5B is a cross-sectional view showing the micro electrostatic motor of FIGS. 5, 5A with layers attached together.

Referring to FIG. 5B, because the membrane layer 24' was also patterned leaving the annular region 48b of the body layer 48 between the annular void 19d and the annular void 19e, the annular region 48b is adhered to the rotor 20 (via adhesive regions 47c and 18c). This annular region 48b effectively leaves a small (width dimension) collar 21 about the fixed axle 18" that rotates along with rotation of the rotor 20. The collar 21 isolates the rotor 20 from the membrane 24' and the body layer 48.

A second adhesive layer (not shown) is patterned to have adhesive material remaining on the bottom surfaces of the walls of the body and a second membrane 28' is disposed on the bottom surfaces of the walls of the body 14. This second membrane 28' (similar to membrane 28 FIG. 4A except for patterning) can be provided with just an adhesive region on the central portion, as shown. In some implementations, the axle 18" can be extended to the backside of the motor 10 repeating the processing discussed above. A motor element 10 with an axle 18" is thus provided by the body layer 14 that is sandwiched between two 5 micro body layers. The axle 18" can extend to one or both major opposing surfaces of the motor 10. Another membrane 52 can be affixed to the body layer 48 with appropriately patterned adhesive regions on the body layer.

Figure 6:
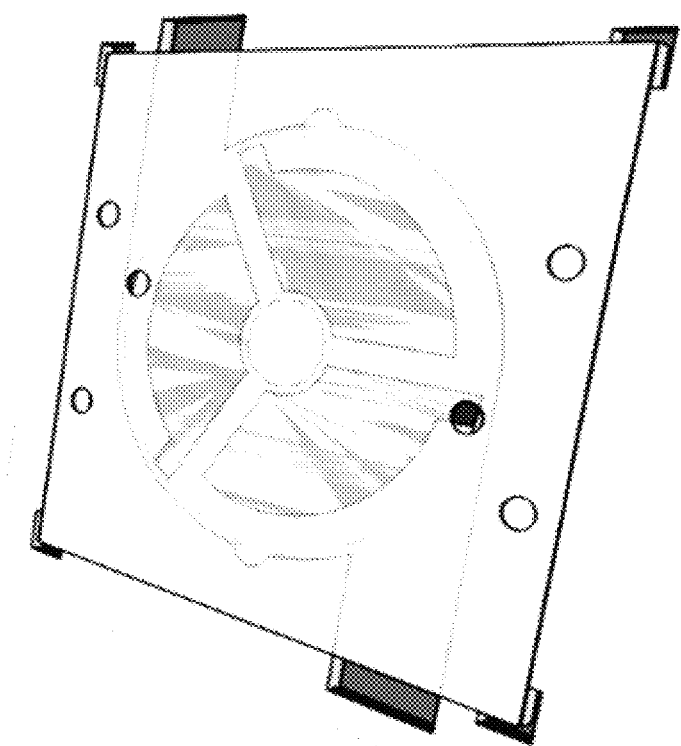
FIG. 6 is a somewhat pictorial, isometric view of the micro electrostatic motor.

An assembled motor 10 having an axel 18" is shown in FIG. 5B, with body layer 48 over membrane 24' body layer 14 and membrane 28'. A pictorial representation of an assembled motor 10 (shaft implementation) is shown in FIG. 6.

Operational Principles

The rotor 20 has the electrodes 16a-16c that collect charge and discharge collected charge as the rotor 20 rotates between the electrodes 16a-16c and the electrodes 36 and 38. Effectively, therefore, between the electrodes 16a-16c and the electrodes 36 and 38 are capacitor elements that build up charge and discharge that charge, as explained above. The charge is dynamic and is related to the capacitance provided by the effective capacitors that are the combination of the electrodes 16a-16c and the electrodes 36 and 38 and the dielectric material between these electrodes. Considering the dielectric constants of the dielectric material between the electrodes 16a-16c and 36 and 38, the area of overlap of these electrodes, and the distance between overlapping pairs of these electrodes 16a-16c and 36 and 38 these capacitors will have capacitances, at least approximated by a formula for a parallel plate capacitor, given as:

$$C=(\epsilon_r+\epsilon_0)A/d$$

Where C is the capacitance, in farads; A is the area of overlap of the two electrodes, in square meters; $\epsilon_r$ is the dielectric constant of the material between the electrodes (sum of dielectric constants of a membrane and fluid); $\epsilon_0$ is the electric constant ($\epsilon_0 \approx 8.854 \times 10^{-12}$ F·m-1); and d is the separation between the plates, in meters, where d is sufficiently small with respect to the smallest chord of A.

Compared to a conventional electrostatic motor used for similar purposes, the electrostatic motor 10 may use less material, and thus is subject to less stress. The electrostatic motor 10 has a size in the micron to millimeter scale.

Asynchronous Motor Operation

Operation of the motor 10 as an asynchronous motor can be explained as follows: Consider a voltage applied between the electrodes 16a-16c and electrodes 36 and 38. Placing a voltage potential difference between the electrodes 16a-16c and the electrodes 36, 38, will have, e.g., positive charge on the electrodes 16a-16c, e.g., 16a and, e.g., negative charge on the electrodes 36, 38, e.g. electrode 38. With electrode 16a having a positive charge and electrode 38 having a negative charge (relative to the charge on 16a), this occurrence will cause the rotor 20 to rotate by attraction of opposite charges. As the rotor 20 rotates initially there is no transfer of charge from the electrode 16a to the electrode 38 due to the dielectric properties of the material(s) separating the electrode 16a from the electrode 38 and due to the relative distance of the electrode 16a from edges of the electrode 38.

However, as an attractive force or torque is produced due to the positive charged electrode 16a being attracted to the negatively charged electrode 38, causing the rotor 20 to rotate (in a counter clockwise direction) and also causing the positively charged electrode 16a to be drawn under the electrode 38. The rotor 20 carrying this positively charged electrode 16a has some momentum and will continue to travel under electrode 38.

However, once one of the tabs 17a-17c of one of the electrodes 16a-16c is in alignment with one of the holes 37a, 37b in membranes, over which is the respective one of electrodes 36, 38, that alignment results in a net transfer of charge from the aligned one of the tabs 17a-17c of the corresponding one of the electrodes 16a-16c on the rotor 20 to the stator electrode 36 or 38.

In the context of FIG. 3, assuming that electrode 38 is negative with respect to electrode 36, e.g., +500 V on electrode 36 and e.g., 0 V on electrode 38, when tab 17a of the electrode 16a becomes in alignment with hole 37b (assuming that it was initially possible charged) a net transfer of charge occurs between the tab 17a (and concomitantly therewith electrode 16a) and stator electrode 38 by arcing of the charge from the electrode 16a to the electrode 38 through the hole 37b. This transfer of charge provided by the arcing of charge from the tab 17a to the electrode 38 leaves the electrode 16a at a net negative charge that now repels the electrode 16a away from electrode 38 and towards electrode 36 that is at a positive charge. Thus, while electrodes 16a-16c are under electrodes 36, 38 there is a charge difference and thus attraction, until the electrode's tab comes under one of the holes 37a, 37b in the electrodes 36, 38, which results in a discharge and repulsion force.

The transfer of charge occurs via an arcing of charge, e.g., an arc (not shown) from one electrode, e.g., electrode 16a having a positive charge through the hole, e.g., hole 37b to a nearby electrode, e.g., electrode 38 having a negative charge from the tab 17a being in proximity to the hole 37b. The arc is produced between the respective one of electrodes 16a-16c (in this explanation electrode 16a via tab 17a) to the corresponding one of the electrodes 36, 38 (in this explanation electrode 38) by virtue of the tab 17a being sufficiently close to the hole 37b, and the hole 37b having a low dielectric constant, e.g., that of air, which is lower than the dielectric constant of the material separating the electrodes 16a-16c from the electrodes 36, 38.

The arc is generated when charge is transferred from one electrode to another electrode. The arc occurs provided that the breakdown voltage of the dielectric that separates the electrodes is overcome. Consider a 5 micron thick membrane that carries an conductive layer of 50 to 500 Angstroms thick, the dielectric breakdown voltage for air is about 3V per micron, thus for air any voltage in excess of about 15 volts will cause an arc to occur when one of the tabs 17a-17c is alignment over one of the holes 37a or 37b. However, the arc that is generated is of sufficiently low energy (i.e., an extremely low current and hence extremely low power) so as not to adversely affect any of the materials that comprise the motor 10. Thus applied voltages of 15 to 500 volts can be applied. More specifically voltages in a range of 15 to 250 volts and more specifically 20 to 50 volts, etc. can be used.

Suffice it to say that the applied voltage would be between the minimal voltage needed to guarantee arcing under the conditions specified above and the maximum voltage being the voltage that would cause some deleterious effects on the materials of the motor 10. Therefore, other voltage ranges would be within the scope of this teaching.

Synchronous Motor Operation

In some implementations, the motor 10 can be operated as a synchronous motor. The synchronous motor example can consider the motor as a variable (rotary) capacitor. A square-wave voltage or sinusoidal wave is applied across electrodes 16a-16c and electrodes 36 and 38. When the motor 10 is running synchronously, the rotor 20 turns one half of a revolution in a one cycle of the voltage. In the quarter revolution, when the rotor 20 and electrodes 16a-16c and stator electrodes 36, 38 are approaching each other there is a voltage between that attracts each other due, e.g., electrodes 16a-16c being positive and stator electrodes 36, 38 being negative. During the next quarter revolution the voltage applied is zero, but the rotor 20 continues to rotate due to inertia.

Figure 7:
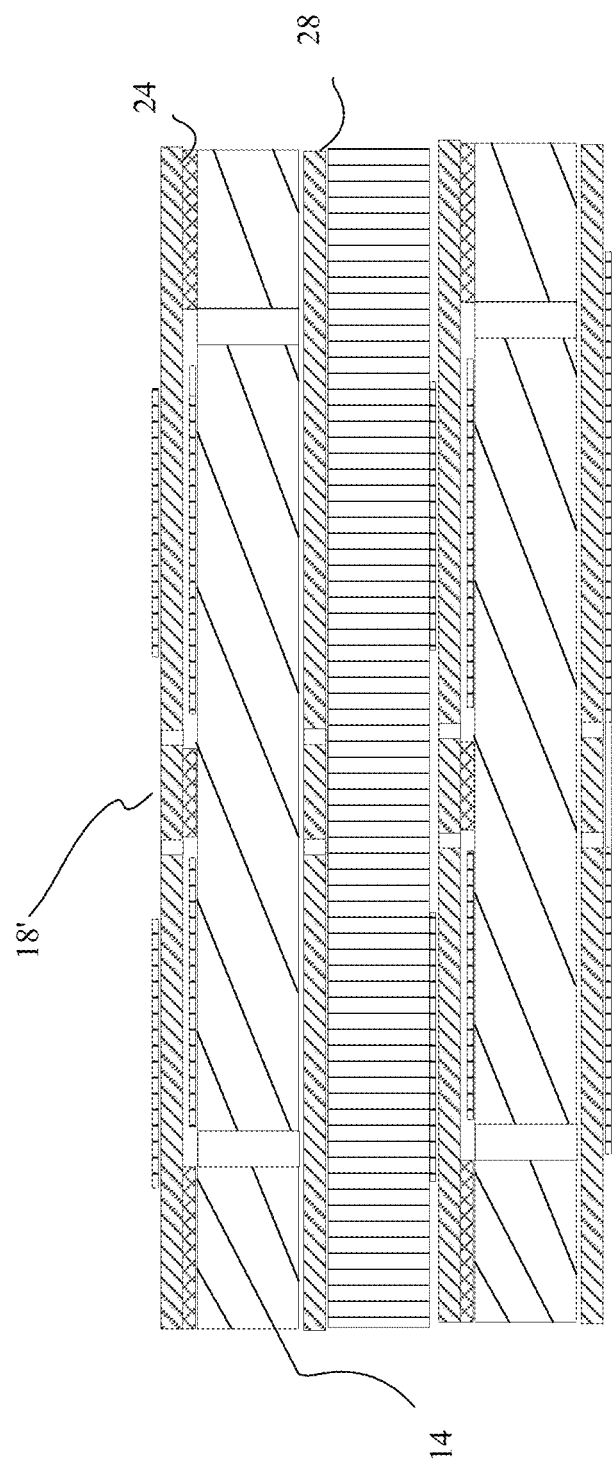
FIG. 7 is a cross-sectional view showing a stacked arrangement of micro electrostatic motors.

Referring to FIG. 7, a stacked arrangement 10' of two of the motors 10 of FIG. 4 (shaft implementation having shaft 18') is shown with a spacer layer 40 (optional). The stacked arrangement 10' includes the two motors 10 of FIG. 4 (each having body layers 14 with membranes 24, 28) and can include top and bottom caps (not shown) or a case (not shown) provided to seal the motors. The caps could be additional body layers that are not patterned, but which are affixed to top and bottom layers of the finished motors 10. A stacked arrangement of two motors 10 of FIG. 5, i.e., the axle implementation, could also be provided along with top and bottom caps (not shown) or a case (not shown).

Micro-Mechanical Force Transfer Device Overview

In some implementations, the micro electrostatic motor 10 (either shaft or axle versions) can be used with micro mechanical force transfer devices.

Micro mechanical force transfer devices described herein are made using micro fabrication methods. The micro mechanical force transfer devices described herein are of the gear type and generally include one or more gears. Plural gears can be intermeshed together in a single module to provide a gear train. Gears can be built up in repeatable layers (of gear modules) to provide complex gearing arrangements of various types. These micro mechanical force transfer devices can be used to accomplish various aspects of mechanical force transfer. For example, the micro mechanical force transfer devices can be used for increasing or decreasing rotational velocity; increasing or decreasing torque, or changing the plane of rotation or changing the direction of rotation (i.e., reversing direction of rotation) of an input force. The input force can originate from either version of the electrostatic motors mentioned above or from other sources. These micro mechanical force transfer devices can find applications in various industrial, commercial, medical, and biological applications. Micro mechanical force transfer device are fabricated on a micron/millimeter scale using roll to roll processing techniques that will be discussed below.

Figures 8A, 8B:
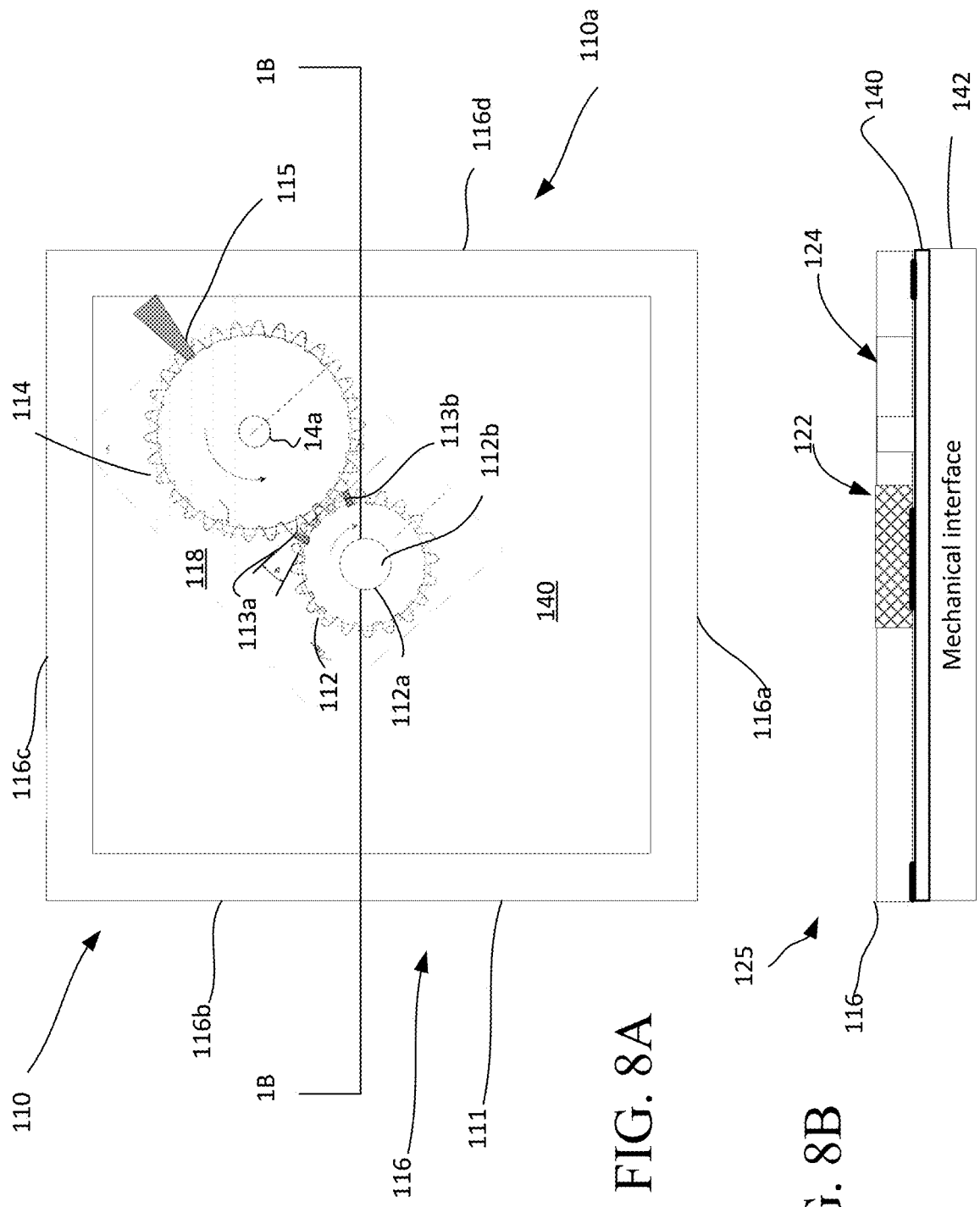
FIGS. 8A, 8B are plan and cross-sectional views respectively of a stage of a micro mechanical force transfer device.

Referring to FIGS. 8A and 8B, a first stage 110a of a micro mechanical force transfer device 110 in a stage of construction is shown. The micro mechanical force transfer device 110 is a gear train device that transfers mechanical force from one driven gear referred to herein as the input gear to another gear referred to herein as the output gear. The first stage 110a includes the input gear 112 that is intermeshed with the output gear 114. In this example, the first stage 110a of the micro mechanical force transfer device 110 (gear train) reduces rotational speed and increases torque between an input force at the input gear 112 and an output force from the output gear 114. However, a gear train that increases rotational speed and reduces torque between the input gear and the output gear could alternatively be built by the input gear having more teeth than the output gear.

The micro mechanical force transfer device 110 includes a gear body frame 116 supported on a membrane 140. The gear body frame 116 has plural walls, e.g., four walls 116a-116d, with interior portions of those walls 116a-116d defining an interior chamber 118. The walls, e.g., walls 116a-116d could optionally have ports that provide fluid ingress or egress from an external fluid source and an external fluid sink (not shown). In other embodiments the walls 116a-116d are solid walls without ports, as shown.

Also shown in FIG. 8A are tether members 113a, 113b and 115. These tether members are bridge elements patterned from the gear body 116 and are used to tether the gears 112 and 114 to the gear body 116 during fabrication processes. Tethers (only three shown) 113a, 113b, 115 are used to keep moveable, rotatable parts in place during early stages of manufacture, but are removed prior to final assembly. Interior portions of the chamber 118 including gaps between teeth can be filled with a lubricating fluid of a low viscosity to provide fluid lubrication and mechanical damping. The first gear 112 is tethered via the pair of tether elements 113a, 113b to the second gear 114. The second gear 114 is tethered to one of the walls 116a-116d, e.g., wall 116d of the gear body 116 by the tether element 115.

Referring to FIG. 8B, a body layer 116 is patterned to provide a gear support structure 125. The first gear 112 (FIG. 8A) is coupled to either a shaft or an axle (not shown) and is supported by a first gear support element 122 and the second gear 114 (FIG. 8A) is supported by a second gear support element 124 of the gear support structure 125. The first gear support element 122 and the second gear support element 124 are positioned under the respective gears 112, 114 (FIG. 8A) to support those gears, as will be discussed below.

Optionally, the second gear 114 (FIG. 8A) in some instances could be coupled either to a shaft (not shown) or an axle (not shown) of the mechanical interface 142, but typically an optional second mechanical interface (not shown) would be positioned over the device 110 to couple to the second gear 114.

In one implementation of the mechanical interface 142, the micro mechanical force transfer device 110 and the membrane 140 is coupled to the shaft 18' of the motor 10 (FIGS. 4, 4A, 4B) and is built up from the motor 10, as will now be described.

Figure 9:
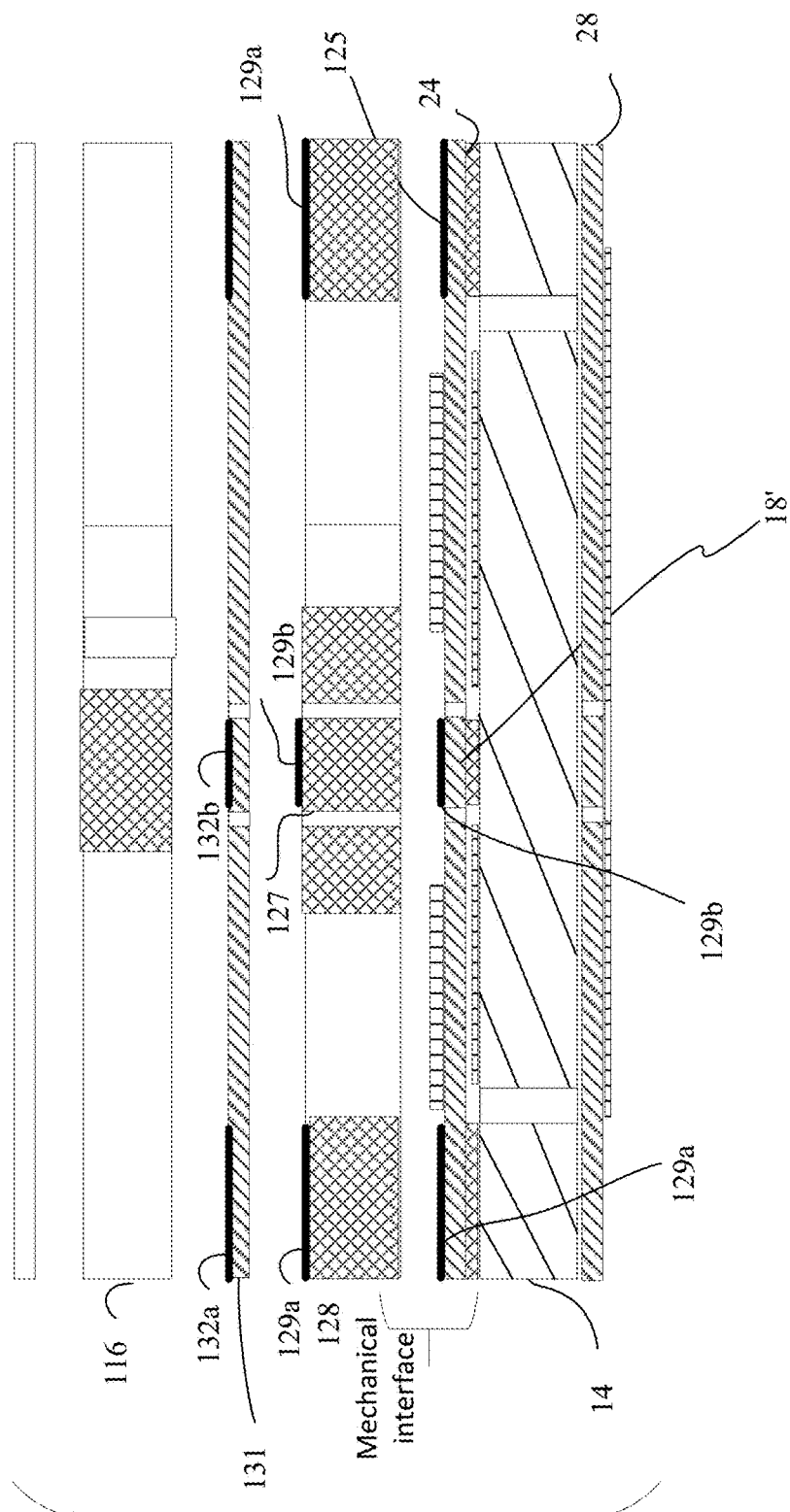
FIG. 9 is a cross-sectional exploded view of a shaft implementation of a micro mechanical force transfer device.

Referring now to FIG. 9, starting with the motor of FIGS. 4, 4A and 4B, (view of FIG. 4B shown) the membrane layer 24 is provided with an adhesive layer (not shown) that is patterned to provide adhesive regions 23a around the membrane 24 over walls 14a-14d (FIG. 1) of the body layer 14 and a central region 23b. For simplicity, the rotor, conductors, etc. are shown but not referenced. On an underside of the body 14 is the membrane 28.

Body layer 128 is disposed over the membrane 24 and adheres to the membrane in regions 129a, 129b having the adhesive. The body layer 128 is patterned to provide an appropriate gear body support structure 125 (analogous to the support structure 125 of FIG. 8B) configured according to the gears that will be provided. The gear body support structure 125 has features of a size similar to those of the gears, e.g., 112, 114 (FIG. 8). The body layer 128 is patterned to provide an annular gap 127 that provides a central region of the material of the body layer 128. (This would be provided for each gear, only gear 112 being shown in cross-section.) An adhesive layer (not shown) is patterned to provide regions 129a and 129b. Another membrane 131 is provided on the body layer 128 with patterned adhesive layers 132a, 132b followed by the gear body layer 116 (see FIGS. 8A and 8B). A surface of the central region of body layer 128 opposite to that having the adhesive 129b adheres to the shaft 18' of the motor 10.

A combination of another membrane layer, gear body support, membrane and gear body layer (all with appropriate patterned adhesive layers and gaps) can be provided over that shown in FIG. 9 to build up a gear train in a vertical dimension. In addition, many more such combinations of a membrane, a gear support, a gear layer and a membrane could be provided to build up complex gearing structures. In addition, many more such gears could be provided within a particular gear body layer with corresponding gear support layer features.

In another implementation of the mechanical interface 142, the micro mechanical force transfer device 110 is coupled to the axle 18' of the motor 10 (FIGS. 5, 5A, 5B) and is built up from the motor 10, as will now be described.

Figure 10:
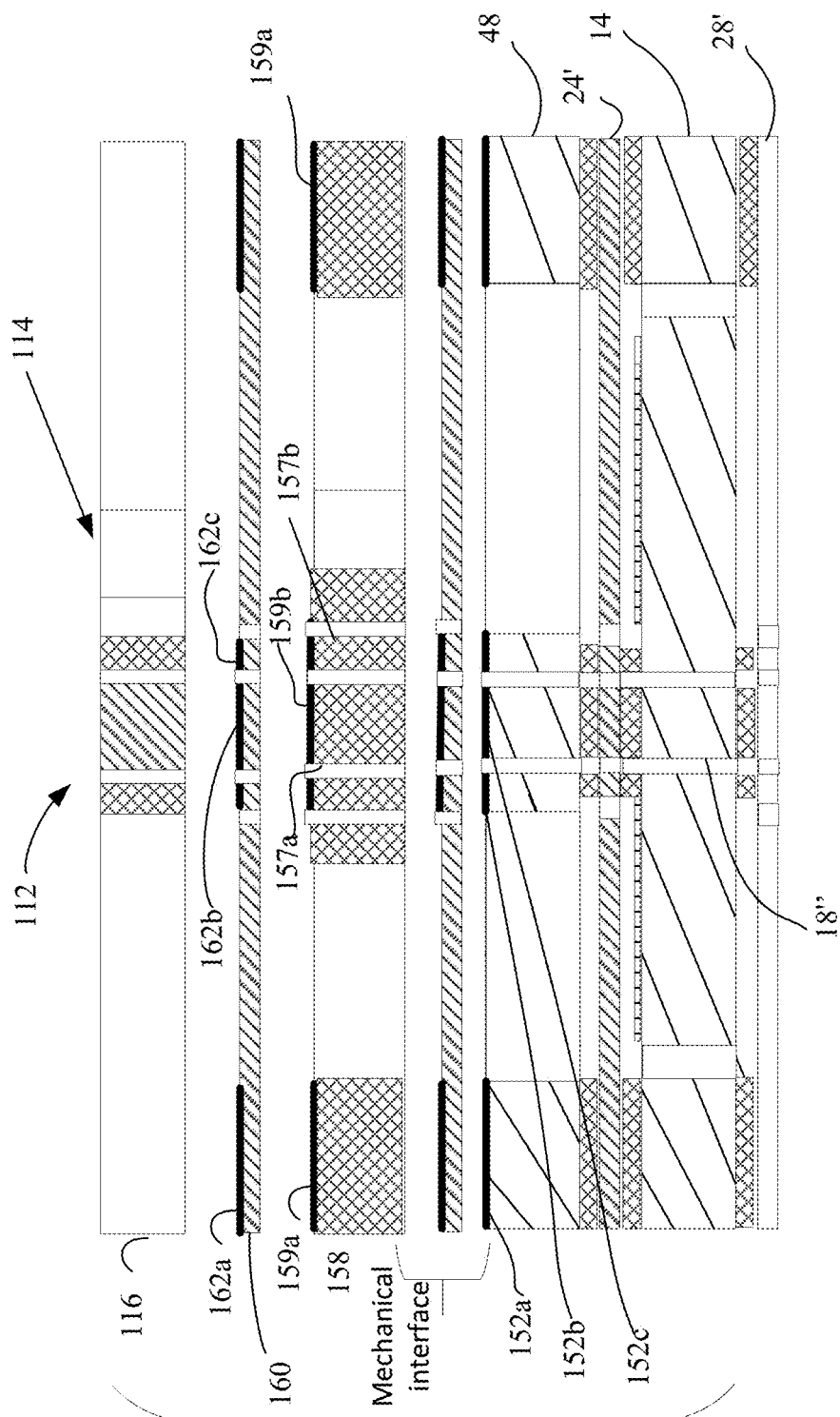
FIG. 10 is a cross-sectional exploded view of an axle implementation of a micro mechanical force transfer device.

Referring now to FIG. 10, starting with the motor 10 of FIGS. 5, 5A and 5B (view of FIG. 5B shown), the motor 10 includes body layer 14, membrane 24' and membrane 28' with axle 18", and body layer 48 is provided with an adhesive layer (not shown) that is patterned to provide an adhesive region 152a around the body layer 48 aligned over walls 14a-14d (FIG. 1) of the body layer 14, an annular adhesive region 152b and a central region 152c. For simplicity, the rotor, conductors, etc. are shown but not referenced. A membrane 154' having patterned annular voids (not referenced) is provided over the body layer 48 and adheres to the body layer 48 in adhesive regions 152a-152c.

In some implementations, a body layer 158 is disposed over the membrane 154' and adheres to the membrane 24' in regions shown but not referenced having adhesive. The body layer 158 is patterned to provide a gear body support. The gear body support has features of a size and extent similar to features of the gears that will be provided. The features are patterned to provide an annular gaps 157a and 157b that provide a central region 159 of the material of the body layer 158. (This would be provided for each gear, only gear 112 being shown in cross-section.) In some implementations, the layer 48 can be provided as the gear support layer, in which case body layer 158 would not be used.

An adhesive layer not shown is patterned to provide regions 159a and 159b. Another membrane 160 is provided on the body layer with patterned adhesive layers 162a, central region 162b and annular region 162c followed by the gear body layer 116 (FIGS. 8A, 8B).

A combination of another membrane layer, gear body support, membrane and gear body layer (all with appropriate patterned adhesive layers and gaps) can be provided over that shown in FIG. 10 to build up a gear train in a vertical dimension. In addition, many more such combinations of a membrane, a gear support, a gear layer and a membrane could be provided to build up complex gearing structures. In addition, many more such gears could be provided within a particular gear body layer with corresponding gear support layer features.

Figure 11:
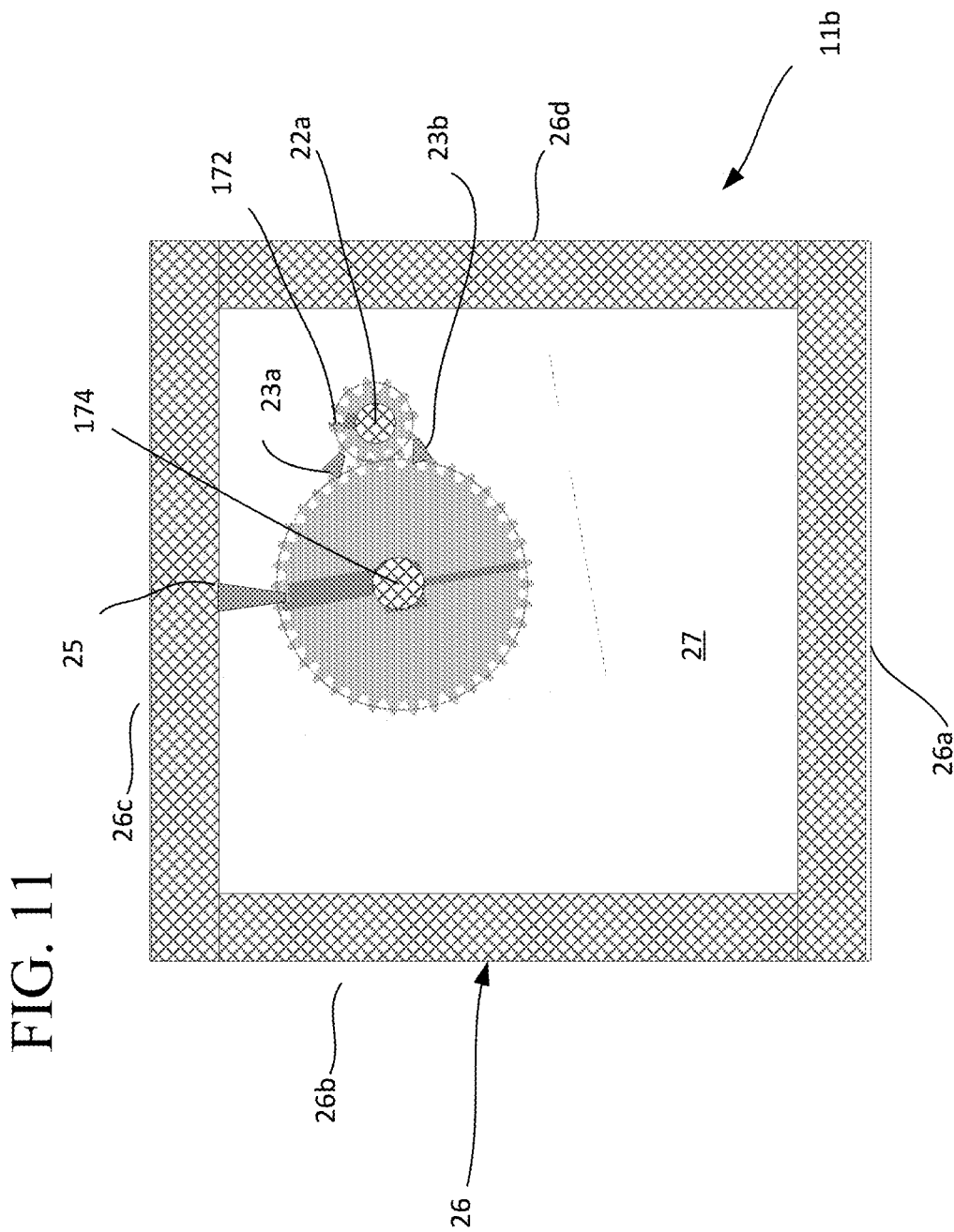
FIG. 11 is plan view of a second stage of a micro mechanical force transfer device.

Referring now to FIG. 11, a second stage 111b of the micro mechanical force transfer device 110 is shown in a stage of construction. The second stage 111b has a gear body 166 with walls 166a-166d enclosing a chamber 167 is another gear train that transfers mechanical force from a third gear 172, e.g., the driving gear or input gear to a fourth gear 174, e.g., the driven or output gear of the second stage.

In this example, the micro mechanical force transfer device stage 111b shown is a second gear train that further reduces rotational speed and increases torque between the input gear 172 and the output gear 174. The second stage 111b includes membrane layers (not shown) a gear support layer (not shown) and the gear layer 111b that can be provided using either the principles discussed for FIG. 9 or FIG. 10 (shaft or axle versions). The gears are tethered with tethers (shown but not referenced).

In operation, one of the gears acts as an input or driving gear, e.g., gear 172 and the other gear, e.g., gear 174 acts as an output or driven gear. In the micro mechanical force transfer device 10 described, the input gear 172 is driven from the first stage 111a (FIG. 1) from the output gear 114 of the micro mechanical force transfer device 110 to transfer force from the first stage 111a to the second different stage 111b of the micro mechanical force transfer device 110. The gears 172, 174 are rotatable either about axles or rotating shafts.

Figure 12:
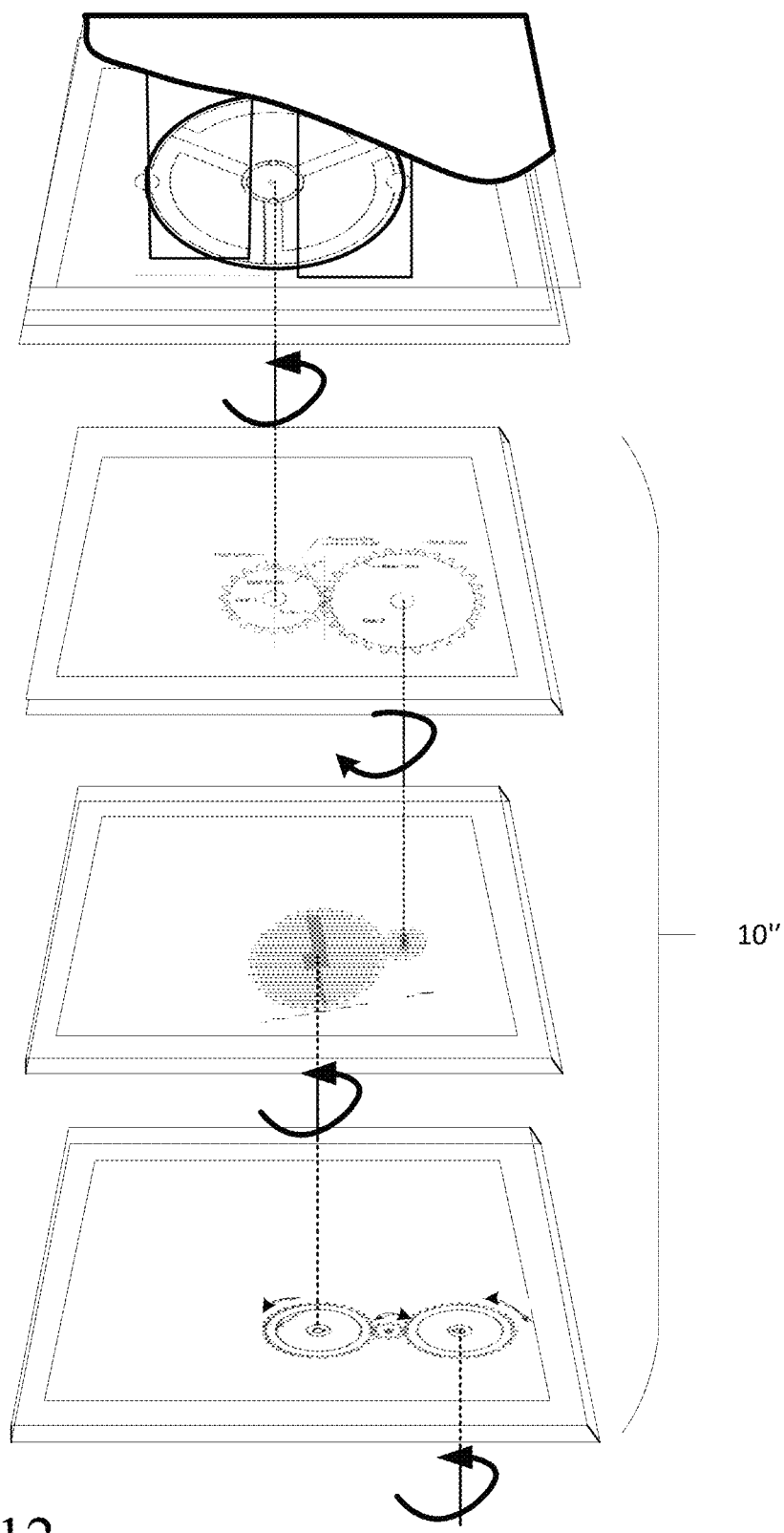
FIG. 12 is a perspective, exploded view respectively of a stacked micro mechanical force transfer device.

Referring now to FIG. 12, a stacked micro mechanical force transfer device 110' having three gear layers (pictorially represented but each being constructed according to FIGS. 8A-10) with the electrostatic motor 10 is shown. The phantom lines represent inter-stage connection points between gears of adjacent stages and the arrows represent rotation directions. Stage 1 (S1) is a driver stage that includes a motor such as the shaft or axle versions of FIG. 4 or 5. Stages 2 and 3 (S2 and S3) are each speed reduction, torque increasing stages that reverse rotational directions. Stage 4 (S4) is a buffer stage that maintains the same direction and speed at the output as the input direction and speed at the input to the stage.

Manufacturing

The electrostatic motor 10 and the micro mechanical force transfer device 10 having the above described features can be manufactured using various methods such as MEMS processing techniques and so-called roll to roll (R2R) processing. The materials for the electrostatic motor 10 are chosen based on the features to be provided by the electrostatic motor 10 and the method of manufacturing of the electrostatic motor 10. Below are some criteria for choosing the materials of the different parts of electrostatic motor 10.

Motor force transfer device body—The material used for the motor body 14 (as well as bodies 24 and 44 and force transfer bodies) may be defined by the requirements. In general, the material needs to be strong or stiff enough to hold its shape to produce the chamber. In some implementations, the material is etchable or photo sensitive so that its features, e.g., the rotor 20 and chamber 12, etc., can be defined and machined/developed. Sometimes it is also desirable that the material interact well, e.g., adheres, with the other materials in the electrostatic motor 10. Furthermore, the material is electrically non-conductive. Examples of suitable materials include SU8 (negative epoxy resist), and PMMA (Polymethyl methacrylate) resist.

Membranes—The material for this part can be an elastic material that along with the body 14 or the force transfer bodies carries conductive layers from which the various electrodes are provided. As such, the material if elastic can bend or stretch back and forth, but such elastic characteristics are not required. The membrane material is impermeable to the fluids of interest, including gas and liquids, is electrically non-conductive, and can have either a low or a high breakdown voltage characteristic. Examples of suitable materials include silicon nitride, and Teflon. Others materials that are stiff are also possible.

Electrodes—The material of the electrodes is electrically conductive. Because the electrodes do not conduct significant amounts of current, the material can have a high electrical sheet resistance, although the high resistance feature is not necessarily desirable. The electrodes are subject to bending and stretching with the membranes, and therefore, it is desirable that the material is supple to handle the bending and stretching without fatigue and failure. In addition, the electrode material and the membrane material adhere well, e.g., do not delaminate from each other, under the conditions of operation. Examples of suitable materials include very thin layers of gold and platinum. Others are possible.

Electrical interconnects—The voltages from the capacitance measurement circuits are conducted to the electrode on each membrane of each chamber. Electrically conducting paths to these electrodes can be built using conductive materials, e.g., gold and platinum.

Other materials—when MEMS processing is used in manufacturing the micro electrostatic motor 10, a sacrificial filling material, e.g., polyvinyl alcohol (PVA), can be used. The sacrificial filling material may also be used in R2R processing. In some implementations, solvents are used in the manufacturing process, which may place additional requirements on the various building materials of the micro electrostatic motor 10. It may be possible to print some of the electrical circuit components onto the membranes. In general, while certain materials have been specified above, other materials having similar properties to those mentioned could be used.

End plates (not shown in the figures) can be placed above and below the finished motor 10 to protect the electrodes and membranes, etc. from an ambient. The finished motor 10 can be packaged in various types of packages such as those used for integrated circuits.

As mentioned above, while several approaches can be used to fabricate the electrostatic motor 10, such as MEMS processing (Microelectromechanical systems) techniques discussed below will be techniques for fabrication by roll to roll processing that can also be applied to formation of other types of devices/systems.

Roll to Roll Processing for Producing the Micro Electrostatic Motor and the Micro Mechanical Force Transfer Device A roll to roll processing line can comprises several stations that can be or include enclosed chambers at which deposition, patterning, and other processing occurs. Processing viewed at a high level thus can be additive (adding material exactly where wanted) or subtractive (removing material in places where not wanted). Deposition processing includes evaporation, sputtering, and/or chemical vapor deposition (CVD), as needed, as well as printing. The patterning processing can include depending on requirements techniques such as scanning laser and electron beam pattern generation, machining, optical lithography, gravure and flexographic (offset) printing depending on resolution of features being patterned. Ink jet printing and screen printing can be used to put down functional materials such as conductors. Other techniques such as punching, imprinting and embossing can be used.

The original raw material roll is of a web of flexible material. In roll to roll processing the web of flexible material can be any such material and is typically glass or a plastic or a stainless steel. While any of these materials (or others) could be used, plastic has the advantage of lower cost considerations over glass and stainless steel. Specific materials will be determined according to the application of the micro electrostatic motor 10. In applications materials such as stainless steel or other materials that can withstand encountered temperatures would be used, such as Teflon and other plastics that can withstand encountered temperatures. With stainless steel however there would be considerations of dielectrics need to ensure electrical isolation among the various elements.

Figure 13:
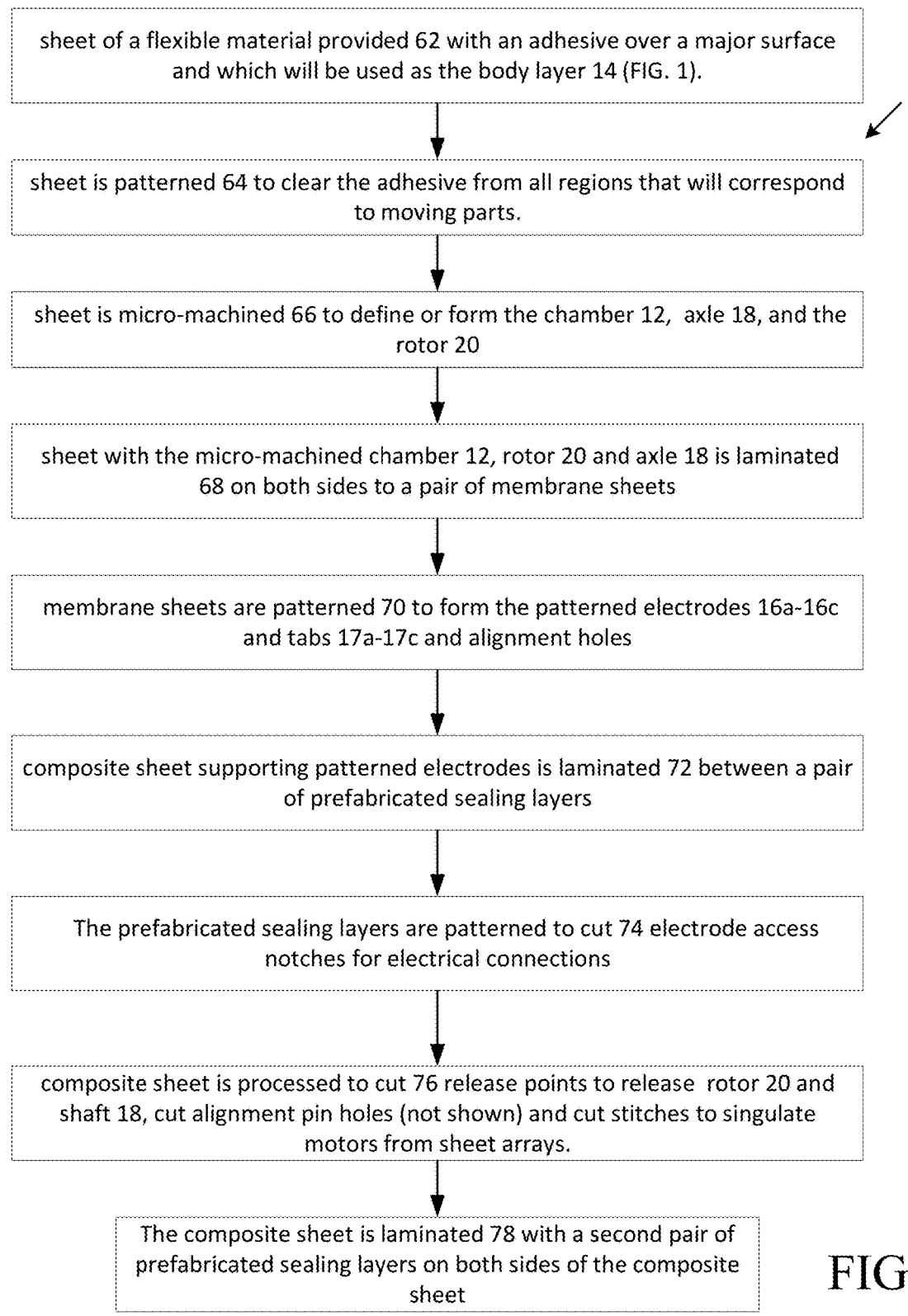
FIG. 13 is flow diagram of roll to roll processing for producing the motor and micro mechanical force transfer device structures.

For the structure shown, stations within a roll to roll processing line are set up according to the processing required. Thus, while the end cap and top caps could be formed on the web or plastic sheet in one implementation the end and top caps are provided after formation of the microelectrostatic motor 10 stack, as will be described. Referring now to FIG. 13, a flow diagram that depicts roll to roll processing 180 to provide the motor 10 is shown (similar processing is used for the micro mechanical force transfer device 110). A sheet of a flexible material (not shown) such a non-metalized 50 micron thick sheet is provided 182 with a double sided adhesive over a major surface and which will be used as the body layer 14 (FIG. 1). The adhesive is a type 1801. For the particular implementation the motor 10, the material is polyethylene terephthalate (PET). Other materials could be used.

The sheet with the adhesive is patterned 184 to clear the adhesive from all regions that will correspond to moving parts. Thus, for example portions of the sheet correspond to the rotor 20 and member 18 portions (FIG. 1) do not have regions of adhesive. A mask (not shown) is used to configure a laser ablation station to remove the adhesive from areas of the sheet within which the those features will be formed.

The sheet is micro-machined 186 using another mask (not shown) or direct write to configure a laser ablation station to define or form the chamber 12 and the rotor 20 tethered as discussed in FIG. 1. Vias are also provided for electrical connections. The micro-machining ablates away the plastic to form the chamber 12, rotor 16, and member 18 in the body 14 (FIG. 1).

In embodiments in which the member 18 is not fixed but rotates there is a small gap between the electrodes on rotor 20 (through the metal, but not the body layer) and the member 18, and the layer of adhesive 18a is not used. In embodiments in which the member 18 is fixed, there is a small gap between the rotor 20 (through the metal and body layer) and the member 18 and the layer of adhesive 18a is used.

The sheet with the micro-machined chamber 12, rotor 20 and member 18 is laminated 188 on both sides to a pair of membrane sheets, e.g., 5 micron thick sheet of PET with a metallic layer of Al of 100 A thickness. The sheet is laminated 188 on both sides to the membrane sheets with the metallic layers of those sheets facing outwards from the body, providing a composite sheet.

The membrane sheets are patterned 190 to form the patterned electrodes 16a-16c and tabs 17a-17c carried by the membranes and providing the rotor 20 disposed in the chamber 12 of the body 14. The rotor 20 is attached to the member 18, allowing both to freely rotate within the chamber 12 (FIG. 4). The sheets are machined to provide alignment holes (not shown) prior to or subsequent to coating with the metallic layer.

The sheets supporting the patterned electrodes are laminated 7192 between a pair of prefabricated sealing layers disposed on both sides of the sheets. The sealing layers are 50 micron sheets having a 1801 adhesive. The prefabricated sealing layers are patterned to cut 74 electrode access notches for electrical connections.

The composite sheet is processed to cut 196 release points to release moving parts, such as the rotor 20 and member 18, cut alignment pin holes (not shown) that are used to position the motor 10 in a fixture and cut stitches that are used to singulate motors from sheet arrays. The composite sheet is laminated 198 with a second pair of prefabricated sealing layers (only layer 182 shown) disposed on both sides of the sheet 170, with the sealing layers being 50 micron sheets having 180I adhesive.

FIGS. 14A-14D and 15A-15F show stages exemplary of roll to roll processing to form gear trains respectively for shaft and axle implementations on the motor 10.

FIGS. 14A-14D show respectively stages of the patterned adhesive on the motor body, patterned membrane layer, patterned body layer with gear support layer features and gear with tethers for shaft versions.

Figure 14A:
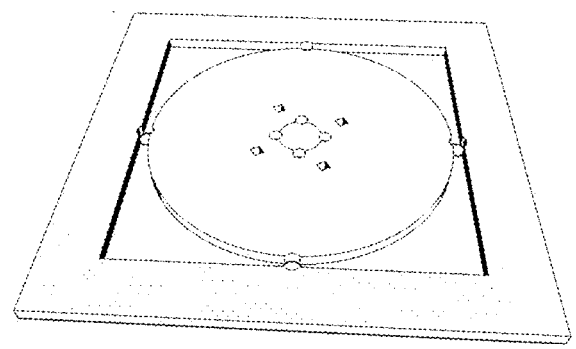
FIGS. 14A-D are somewhat perspective views showing certain of the stages of construction of a shaft implementation of a micro mechanical force transfer device.
Figure 14B:
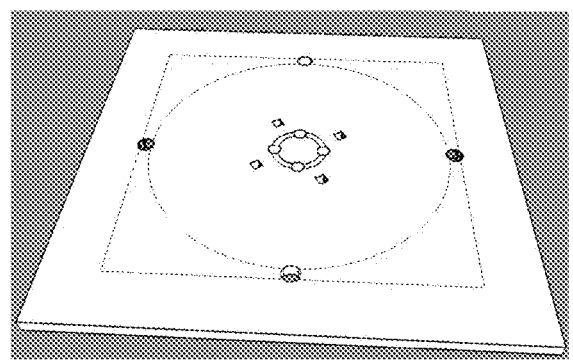
Figure 14C:
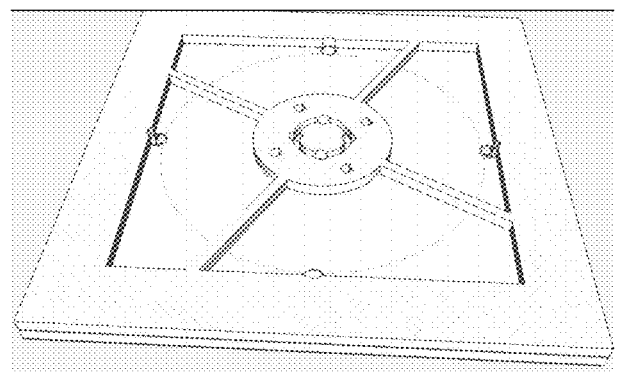
Figure 14D:
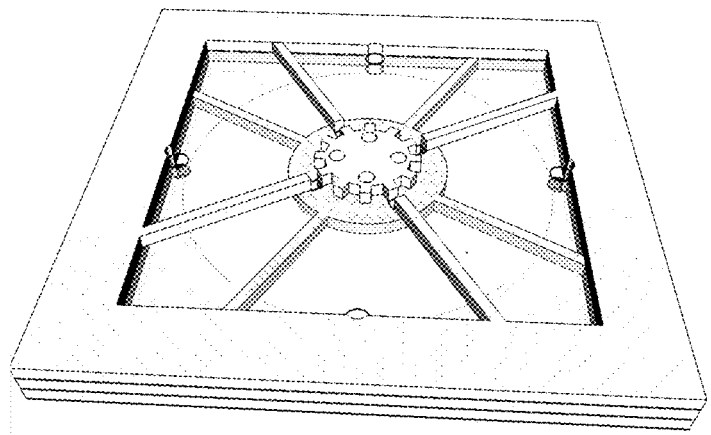

In particular shown in FIG. 14A is the central disk 16 without tethers to the body 14, in FIG. 14B is shown a membrane layer over the arrangement in FIG. 14A. In FIG. 14C is shown a tether arrangement that has four tethers 200a-200d securing a gear support to walls of the gear support body over the central disk 16 and four tethers 202a-202d tethering the shaft to the gear support. In FIG. 14D is shown another tether arrangement that has four tethers 210a-210d securing a gear to walls of the gear module and supporting the gear over the gear support of FIG. 14C. FIGS. 15A-15F show respectively stages of the patterned adhesive on the motor body, patterned membrane layer, patterned body layer with gear support layer features, collar formation layer, membrane layer, and gear with tethers for axle versions.

Figure 15A:
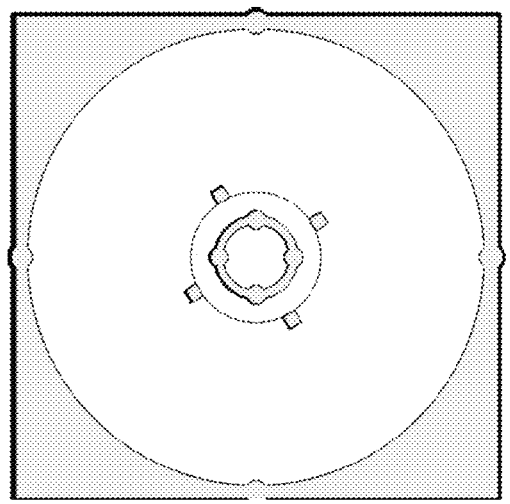
FIGS. 15A-F are somewhat perspective views showing certain of the stages of construction of an axle implementation of a micro mechanical force transfer device.
Figure 15B:
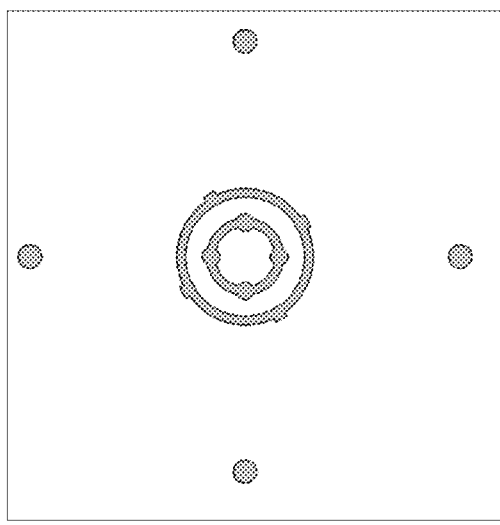
Figure 15C:
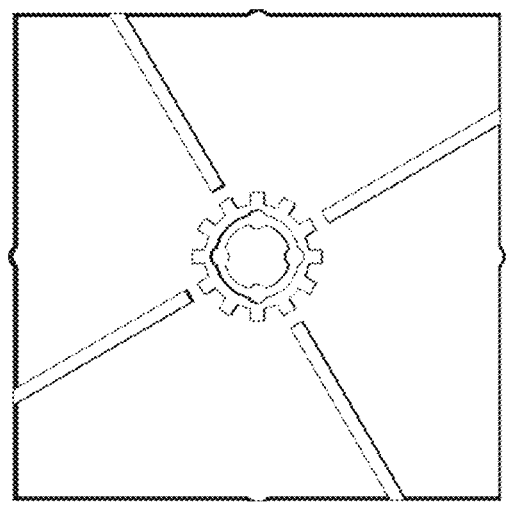
Figure 15D:
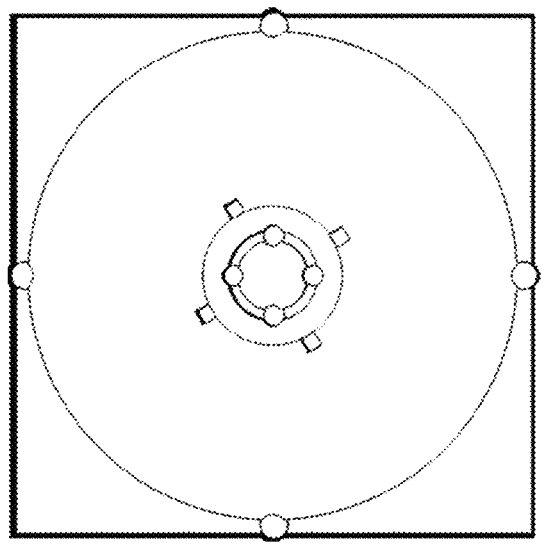
Figure 15E:
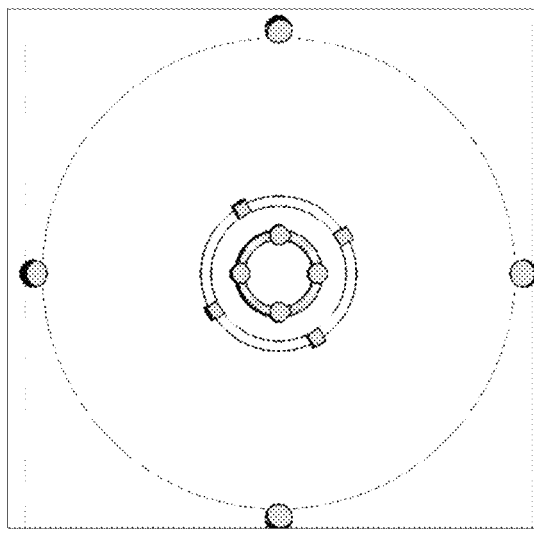
Figure 15F:
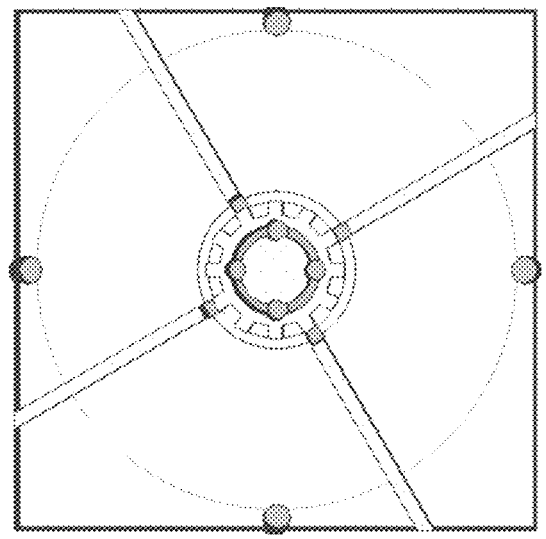

In particular shown in FIG. 15A is the central disk 16 without tethers to the body 14, in FIG. 14B is shown a membrane layer 24' over the arrangement in FIG. 14A patterned to provide the two annular gaps 19b, 19c (FIG. 5A). In FIG. 15C is shown a tether arrangement that has four tethers (not referenced) that secures a gear to walls of a gear body over the central disk 16. In FIG. 15D is shown the tether arrangement that has the four tethers cut (not referenced). In FIGS. 15E and 15F is shown formation an external interface of the axle implementation.

The figures of FIG. 14A-14D and FIGS. 15A-15F roughly correspond to exemplary masks for etching of the corresponding features.

The above techniques can also use a machine vision system produce a data file that is used by the laser ablation system in aligning a laser ablation station with a mask (or direct write) such that a laser beam from the laser ablation system provides features according to the mask used in registration with the corresponding portions of the bodies, as discussed. The electrodes are formed by ablating away the metal in regions that are not part of the electrodes and conductors, leaving isolated electrodes and conductors on the sheet.

A jig or test fixture (not shown) can be used in conjunction with the alignment pin holes. Other stacking techniques for assembly are possible with or without the alignment pin holes.

Via conductors to interconnect the patterned electrodes on stacked motors 10 are connected via conductors that are castellated structures, i.e., with relatively wide areas contacting electrode tabs and relatively narrow areas through holes in the electrode. This arrangement is provided by having the holes in the body portions larger than the holes through the electrode portions. This can be accomplished during the patterning stages of the body and the electrodes respectively. The via conductors are formed by introduction of the conductive inks mentioned above into the holes.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

Other embodiments are within the scope of the following claims. For example other techniques to adhere (i.e., affix) layers together could be used such as laser welding, etc.

What is claimed is:

1. A micro electrostatic motor comprises:
    a body having a first and a second face and having a circular chamber defined by an interior wall;
    a central member;
    a disk disposed in the circular chamber, the disk physically spaced from the interior wall of the chamber;
    a set of three mutually electrically isolated electrodes supported on a first surface of the disk, with each of the electrodes having a tab portion and with the electrodes being electrically isolated from the central member;
    a first membrane over the first face of the body;
    a second membrane over the second face of the body; and
    a pair of spaced electrodes on portions of the second membrane, the pair of spaced electrodes being electrically isolated by a gap.

2. The micro electrostatic motor of claim 1 wherein the pair of second electrodes each have a first aperture in a portion of each of the second pair of electrodes to accommodate a conductive via to make an exterior electrical connection.

3. The micro electrostatic motor of claim 1 wherein the second membrane supporting the pair of second electrodes has a pair of apertures in portions of the second membrane over a path that the tabs travel due to rotation of the disk member.

4. The micro electrostatic motor of claim 1 further comprising:
    a first sealing layer over the first membrane and a second sealing layer over the second membrane.

5. The micro electrostatic motor of claim 1 wherein the central member is a fixed member that is affixed between the first and the second membranes, and the central member is spaced from the disk by an annular gap.

6. The micro electrostatic motor of claim 5 wherein the central member is attached to the disk.

7. The micro electrostatic motor of claim 1 wherein the central member is spaced from the disk an annular gap; the motor further comprises:
    a membrane layer having a central region that is adhered to the central member, and having a first annular gap in alignment with the annular gap between the disk and central member and a second annular gap about an outer periphery of the first annular gap in the membrane layer; and
    a spacer layer having a central region that is adhered to the central region of the membrane layer, and having a first annular gap in alignment with the annular gap between the disk and central member and the first annular gap of the membrane, and having a second annular gap about an outer periphery of the first annular gap in the spacer layer.

8. The micro electrostatic motor of claim 1 further comprising:
    a ground plane disposed on the first membrane.

9. The micro electrostatic motor of claim 1 wherein the body member has a pair of ports to allow fluid flow through the chamber.

10. The micro electrostatic motor of claim 1 wherein the disk and the central member are comprised of a material that also comprises the body.

11. A micro electrostatic motor comprises:
a body having a first and a second face, and an interior wall defining a circular chamber;
a disk disposed in the circular chamber, the disk physically spaced from the interior wall of the circular chamber, the disk having
a central member portion;
a set of three mutually electrically isolated electrodes supported on a first surface of the disk, with each of the electrodes having a tab portion and being electrically isolated from the central member portion;
a first membrane over the first face of the body, the first membrane in contact with surface portions of the at least outer wall and interior wall of the body and a surface of the central member portion, with the first membrane having
an annular void defined around the portion of the first membrane in contact with the central member;
a second membrane in contact with the second face of the body, the second membrane in contact with the at least outer wall and interior wall of the body; and
a pair of spaced electrodes on portions of either the first or the second membrane, the pair of spaced electrodes being electrically isolated by a gap.

12. The micro electrostatic motor of claim 11 wherein the pair of second electrodes each have a first aperture in a portion of each of the second pair of electrodes to accommodate a conductive via to make an exterior electrical connection.

13. The micro electrostatic motor of claim 11 wherein the first membrane supports the pair of second electrodes and has apertures in portions of the first membrane over a path that the tabs travel due to rotation of the disk member.

14. The micro electrostatic motor of claim 11 wherein the annular void defined about the portion of the first membrane in contact with the central member frees the central member to rotate with the disk that provides a shaft as the combination of the portion of the first membrane in contact with the central member and the annular void.

15. The micro electrostatic motor of claim 11 wherein the second membrane is further in contact with an opposing surface of the central member, the second membrane having an annular void defined around the portion of the second membrane in contact with the opposing surface of the central member.

16. A micro electrostatic motor comprises:
a body having a first and a second surface, the body having an outer wall and an interior wall, the interior wall defining a circular chamber;
a disk disposed in the circular chamber, the disk physically spaced from the interior wall of the chamber, the disk having
a central member portion having an annular gap that spaces central member portion from the disk; and
a set of three mutually electrically isolated electrodes supported on a first surface of the disk, with each of the electrodes having a tab portion and being electrically isolated from the central member portion;
a first membrane layer disposed on the first surface of the body having a central region that is adhered to the central member portion and having a first annular gap in alignment with the annular gap that spaces central member portion from the disk, and a second annular gap about an outer periphery of the first annular gap; and
a spacer layer having a central region that is adhered to the central region of the membrane layer, and having a first annular gap in alignment with the annular gap that spaces the central member portion from the disk and further in alignment with the first annular gap in the membrane;
a second membrane in contact with the second surface of the body at the at least outer wall and the central member portion; and
a pair of spaced electrodes on portions of either the first or the second membrane, the pair of spaced electrodes being electrically isolated by a gap.

17. The micro electrostatic motor of claim 16 wherein the pair of second electrodes each have a first aperture in a portion of each of the second pair of electrodes to accommodate a conductive via to make an exterior electrical connection.

18. The micro electrostatic motor of claim 17 wherein the first membrane supports the pair of second electrodes and has a apertures in portions of the first membrane over a path that the tabs travel due to rotation of the disk member.

19. The micro electrostatic motor of claim 16 wherein the first annular void defined about the portion of the first membrane in contact with the central member affixes the central member to inhibit rotation of the central member to define an axle as the combination of the portion of the first membrane in contact with the central member and the first annular void; and the annular region defined between the first and second annular voids, defines an collar to transfer rotation of the disk about the axle.

20. The micro electrostatic motor of claim 16 wherein the surface of the disk is a first surface, and the second membrane is further in contact with an opposing surface of the central member, the second membrane, the second membrane having a first annular void defined around the portion of the second membrane in contact with the central member, and having a second annular void defined around and spaced from the first annular void, the first and second annular voids defining an annular region of the first membrane that is in contact with a second surface of the disk.

21. A micro electrostatic motor comprises:
a first motor stack comprising:
a first body having a first chamber;
a first membrane over a first face of the first body; and
a first disk rotatably disposed in the first chamber having on a first surface thereof a first set of three mutually electrically isolated electrodes, with each of the electrodes having a tab portion;
a second motor stack comprising:
a second body having a second chamber;
a second membrane over a first face of the second body; and
a second disk rotatably disposed in the second chamber having on a first surface thereof a second set of three mutually electrically isolated electrodes, with each of the electrodes having a tab portion; and
an interface between the first motor stack and the second motor stack.

* * * * *